US 6,630,688 B2

(12) United States Patent
Kong et al.

(10) Patent No.: US 6,630,688 B2
(45) Date of Patent: Oct. 7, 2003

(54) CONTACT STRUCTURES OF WIRINGS AND METHODS FOR MANUFACTURING THE SAME, AND THIN FILM TRANSISTOR ARRAY PANELS INCLUDING THE SAME AND METHODS FOR MANUFACTURING THE SAME

(75) Inventors: Hyang-Shik Kong, Suwon (KR); Myung-Koo Hur, Yongin (KR); Chi-Woo Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/837,374

(22) Filed: Apr. 19, 2001

(65) Prior Publication Data

US 2001/0032981 A1 Oct. 25, 2001

(30) Foreign Application Priority Data

Apr. 19, 2000 (KR) ........................................ 2000-20807

(51) Int. Cl.[7] .............................................. H01L 29/04
(52) U.S. Cl. ..................... 257/72; 257/59; 257/765; 349/139; 349/148; 349/152
(58) Field of Search .............................. 349/42, 43, 46, 349/139, 148, 152; 257/59, 72, 765, 626, 771, 784

(56) References Cited

U.S. PATENT DOCUMENTS

| | | | | |
|---|---|---|---|---|
| 5,998,230 A | * | 12/1999 | Gee-Sung et al. | ............. 257/72 |
| 6,287,899 B1 | * | 9/2001 | Park et al. | ................... 438/149 |
| 2001/0019125 A1 | * | 9/2001 | Hong et al. | ................... 257/72 |
| 2002/0030190 A1 | * | 3/2002 | Ohtani et al. | ................... 257/72 |

FOREIGN PATENT DOCUMENTS

| KR | 1998-079255 | 11/1998 |
|---|---|---|
| KR | 1999-0077818 | 10/1999 |

* cited by examiner

Primary Examiner—Minh Loan Tran
(74) Attorney, Agent, or Firm—McGuire Woods LLP

(57) ABSTRACT

First, a conductive material of aluminum-based material is deposited and patterned to form a gate wire including a gate line, a gate pad, and a gate electrode. A gate insulating layer is formed by depositing nitride silicon in the range of more than 300° C. for 5 minutes, and a semiconductor layer an ohmic contact layer are sequentially formed. Next, a conductor layer of a metal such as Cr is deposited and patterned to form a data wire include a data line intersecting the gate line, a source electrode, a drain electrode and a data pad. Then, a passivation layer is deposited and patterned to form contact holes exposing the drain electrode, the gate pad and the data pad. Next, indium zinc oxide is deposited and patterned to form a pixel electrode, a redundant gate pad and a redundant data pad respectively connected to the drain electrode, the gate pad and the data pad.

13 Claims, 31 Drawing Sheets

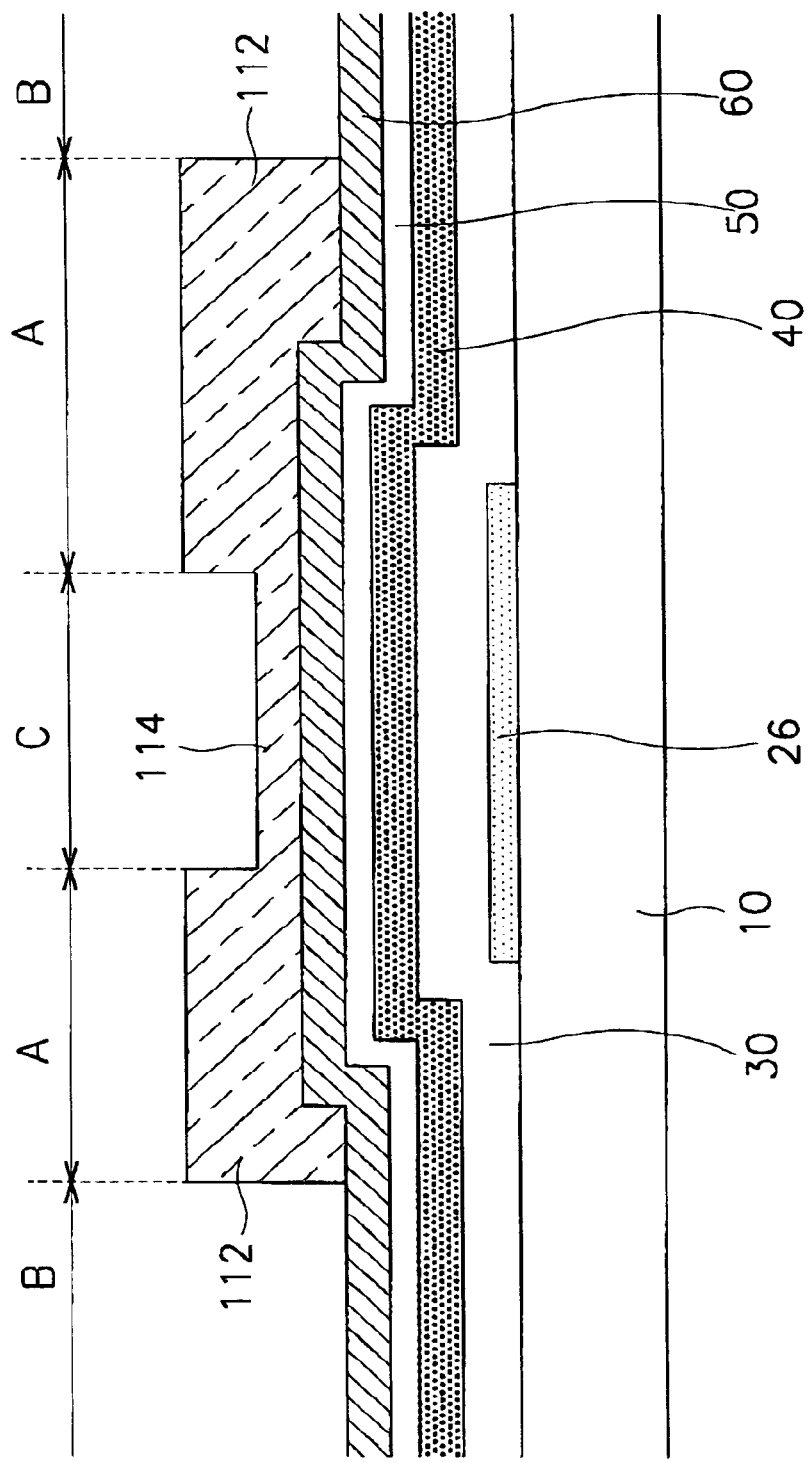

CONTACT STRUCTURES OF WIRINGS AND METHODS FOR MANUFACTURING THE SAME, AND THIN FILM TRANSISTOR ARRAY PANELS INCLUDING THE SAME AND METHODS FOR MANUFACTURING THE SAME

BACKGROUND OF THE INVENTION (a) Field of the Invention

The present invention relates to contact structures of wirings and methods for manufacturing the same, and thin film transistor array panels including the same and methods for manufacturing the same.

(b) Description of the Related Art

Generally, wiring of semiconductor devices is to transmit signals without delay.

In order to prevent delay or distortion of signals, materials having a low resistivity such as aluminum or aluminum alloys are generally used. However, the physical and the chemical properties of the aluminum or aluminum alloy is not good. In other words, the aluminum or aluminum alloy is easily oxidized and broken, when connecting other conductive material in a contact portions. Accordingly, the characteristics of semiconductor devices are deteriorated. Especially, it causes problems when ITO (indium tin oxide) as a transparent electrode such as in a liquid crystal display is used to reinforce pad portions of aluminum. However, because of the poor contact properties between aluminum or aluminum alloy and indium tin oxide (ITO), the aluminum or aluminum alloy must be removed to prevent the corrosion of aluminum and aluminum alloy and a different material is then inserted therebetween. Accordingly, the manufacturing method is complicated and production costs are increased.

In general, a thin film transistor array panel is manufactured by a photolithography process. Since the photolithography process is expensive, the number of the photolithography steps needs to be minimized.

SUMMARY OF THE INVENTION

It is therefore an object of the present invention to provide contact structures having good contact properties of wiring made of a material of low resistivity and methods for manufacturing the same.

It is another object of the present invention to provide a thin film transistor array panels having contact structures of good contact properties and methods for manufacturing the same.

It is another object of the present invention to simplify manufacturing methods of thin film transistor array panels for liquid crystal displays.

These and other objects are provided, according to the present invention, by forming a wire made of a metal of aluminum-based material and a conductive layer, which is connected to the wire, made of indium zinc oxide.

In a manufacturing method of a contact structure of a wire, a wire made of a metal layer including aluminum-based material is formed, and an insulating layer covering the wire is deposited. Then, the insulating layer is patterned to form a contact hole exposing the wire, and a conductive layer, which is electrically connected to the wire and made of indium zinc oxide, is formed.

It is desirable that the insulating layer is made of nitride silicon, and the insulating layer is deposited in the range of 280–400° C. and during 5–40 minute, to include anneal process.

The contact structure of the wire and the method for manufacturing the same may be adapted to a manufacturing method of a thin film transistor array panel.

A gate wire including a gate pad and made of a metal layer of aluminum-based material is formed, and a gate insulating layer covering the gate wire is formed. A semiconductor layer and a data wire are sequentially formed, then the gate insulating layer is patterned to form a contact hole exposing the gate pad. Next, a conductive layer made of indium zinc oxide (IZO) and connected to the gate pad is formed.

It is desirable that the gate insulating layer of nitride silicon is deposited in the range of 280–400° C. and 5–40 minute.

More concretely, a metal layer including aluminum-based material is deposited and patterned on an insulating substrate to form a gate wire including a gate line, a gate electrode connected to the gate line and a gate pad connected to the gate line, and a gate insulating layer is deposited. A semiconductor layer is formed, and a conductive layer is deposited thereon and patterned to form a data wire including a data line intersecting the gate line, a source electrode connected to the data line and adjacent to the gate electrode and a drain electrode opposite of the source electrode with respect to the gate electrode. Next, a passivation layer is deposited and patterned along with the gate insulating layer to form a first contact hole exposing the gate pad. A conductive layer pattern including a redundant gate pad connected to the gate pad through the first contact hole is formed on the passivation layer.

Here, it is desirable that the insulating layer and the passivation layer are deposited in the range of 280–400° C. and made of nitride silicon.

The conductive layer pattern may be indium zinc oxide.

The data wire further comprises a data pad connected to the data line, and a redundant data pad and a pixel electrode, which are respectively connected to the data pad and the drain electrode through a second and a third contact holes of the passivation layer, may be formed when forming the redundant gate pad.

The data wire and the semiconductor layer are together formed by photolithography process using a photoresist pattern having different thicknesses depending on the positions. The photoresist pattern may have a first portion having a first thickness, a second portion having a second thickness thicker than the first portion, and a third portion having a third thickness thinner than the first thickness and except for the first and the second portions.

A mask used for forming the photoresist pattern may have a first, a second, and a third part, a transmittance of the third part is higher than the first and the second parts, a transmittance of the first part is higher than the second part. The first and the second portion of the photoresist pattern may be respectively aligned on portion between the source electrode and the drain electrode, and the data wire.

It is desirable that the first part of the mask includes a partially transparent layer, or a slit pattern smaller than the resolution of the exposure used in the exposing step, to regulate the transmittance of the first part, and the thickness of the first portion is less than a half of the thickness of the second portion.

An ohmic contact layer may be formed between the data wire and the semiconductor layer, and the data wire, the ohmic contact layer, and the semiconductor layer may be formed in the same photolithography process.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 12B and 12C are respectively cross-sectional views taken along the lines XIIB-XIIB' and XIIC-XIIC' of FIG. 12A.

DETAILED DESCRIPTION OF THE PREFERRED EMBODIMENTS

Figure 1:
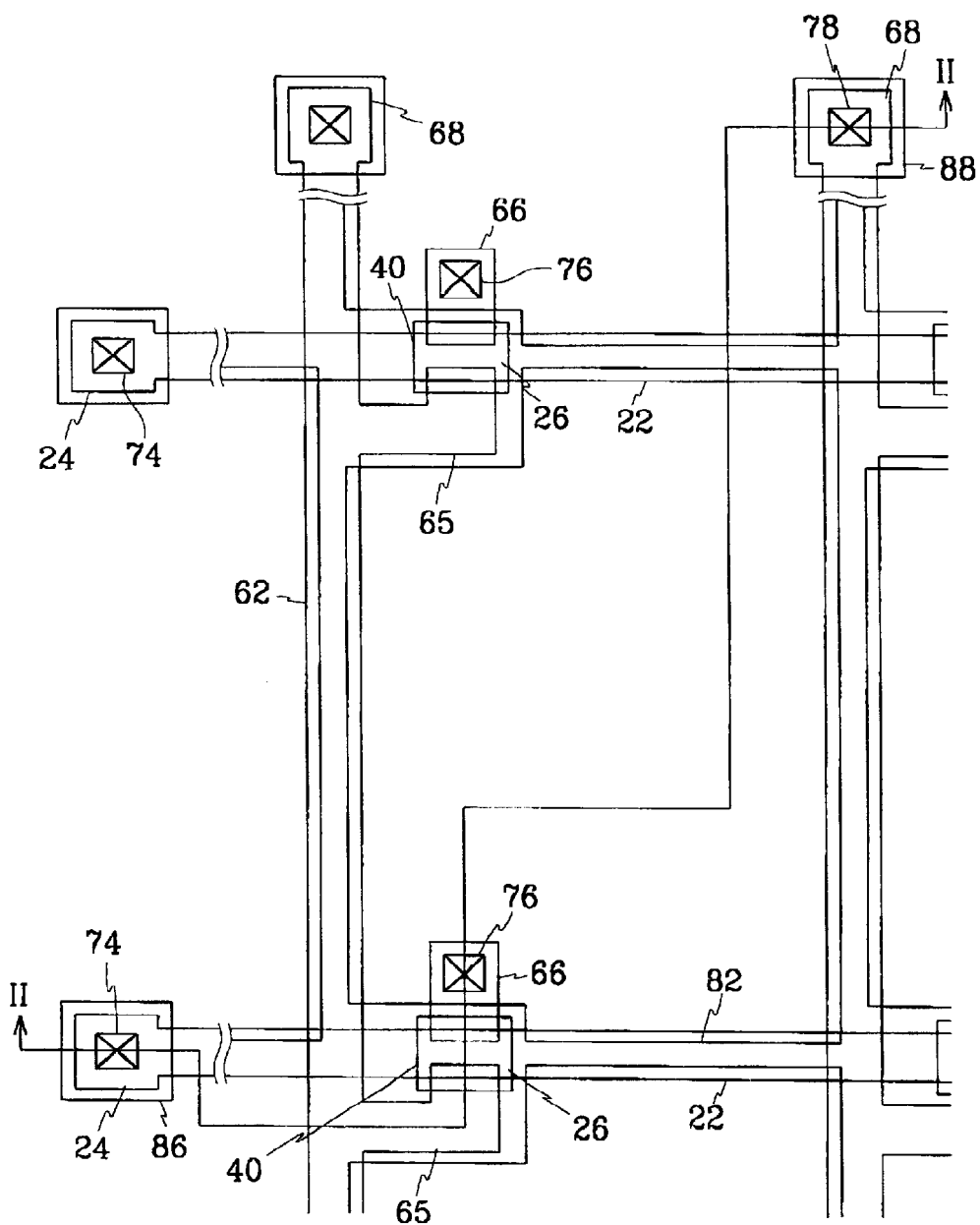
FIG. 1 is a layout view of a thin film transistor array panel for a liquid crystal display according to the first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

A wiring of a semiconductor device is made of a material, which has a low resistivity less than 15 $\mu\Omega$cm, such as aluminum, aluminum alloy. This wiring generally is connected to different conductive layer to receive external electrical signals from outside or to deliver electrical signals to outside. The wiring should not be easily corrupted on the connection to the different conductive layer during manufacturing processes. In a method for manufacturing a contact structure of a wiring according to the present invention, a wiring made of material having a low resistivity such as aluminum, aluminum alloy is formed on a substrate, and an insulating layer covering the wiring is deposited. Next, the insulating layer is patterned to form a contact hole exposing the wiring, then a conductive layer made of IZO (indium zinc oxide) and connected to the wire through the contact hole is formed. The corrosion between the aluminum or aluminum alloy wiring and the IZO is not generated in this contact structure of the wiring according to the present invention. At this time, the contact resistance of the contact structure may be less than 10% of wire resistance of the wire, and 0.15 $\mu\Omega$cm$^2$. It is desirable that the square of the contact hole is less than 2 mm×60 $\mu$m and more than 0.5 mm×15 $\mu$m.

Furthermore, the insulating layer may be made of nitride silicon, may be deposited in the range of 280–400° C. for 5–40 minutes, and the IZO thin film may be formed through sputtering process by using the target including In$_2$O$_3$ and ZnO that comprises 15–20 at % (atomic percentage) of Zn. Here, the Zn content is represented by at % using a formula of [Zn/(Zn+in)]×100. Oxygen may or may not be included.

This contact structure of the wiring is adapted to a thin film transistor array panel.

A structure of the TFT array panel and a method for manufacturing the same will now be described specifically.

First, the structure of a TFT array panel for a liquid crystal display according to the first embodiment of present invention will now be described specifically with reference to FIGS. 1 and 2.

Figure 2:
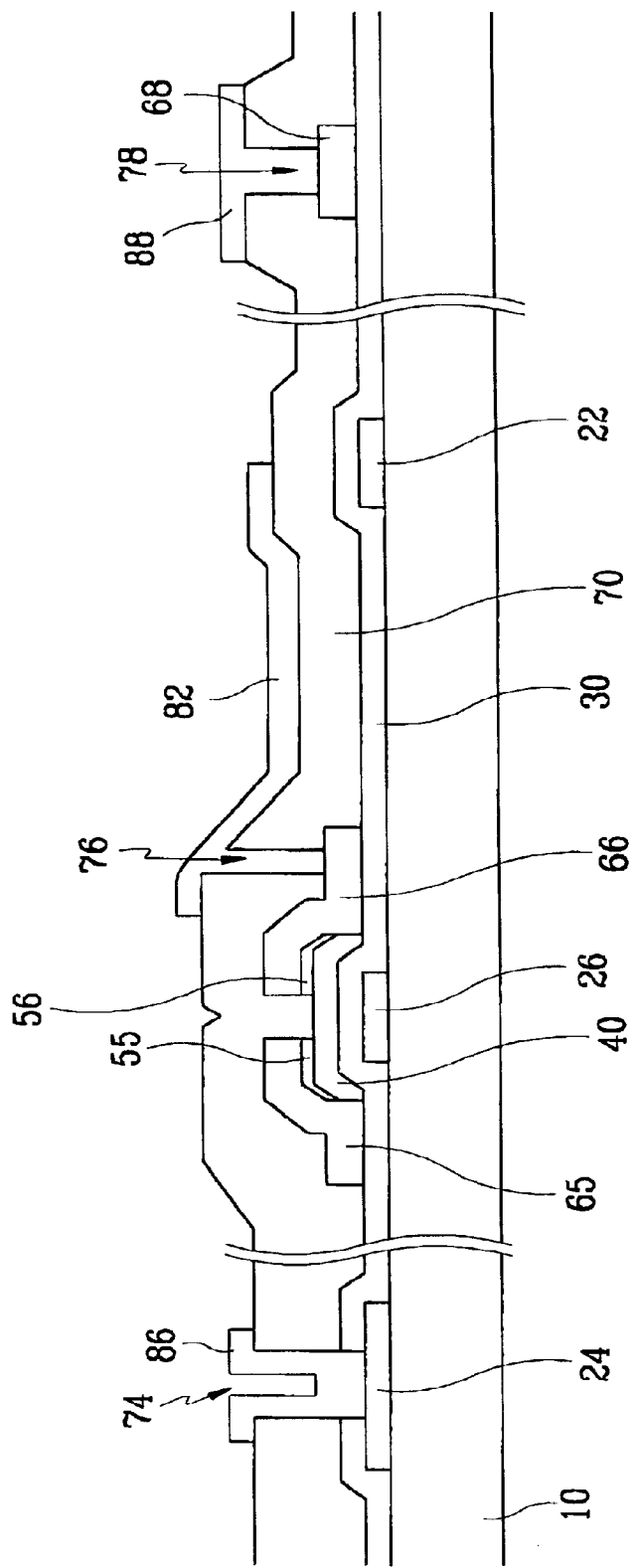
FIG. 2 is cross-sectional view taken along lines II-II' of FIG. 1.

FIG. 1 is a layout view of a thin film transistor array panel for a liquid crystal display according to the first embodiment of the present invention, and FIG. 2 is a cross-sectional view taken along line II-II' of FIG. 1.

Gate wires made of conductive material having a low resistivity, such as aluminum (Al) or aluminum alloy (Al alloy), is formed on an insulating substrate 10. A gate wire includes a gate line (or scanning signal line) 22 extending in the horizontal direction in FIG. 1, a gate pad 24 connected to an end of the gate line 22 and which transmits a scanning signal from an external circuit to the gate line 22, and a gate electrode 26 which is a part of a thin film transistor and connected to the gate line 22.

A gate insulating layer 30 of silicon-nitride (SiNx) is formed on and covers the gate wire parts 22, 24, and 26.

A semiconductor layer 40 (made of semiconductor such as hydrogenated amorphous silicon) is formed in an islandlike shape on the gate insulating layer 30 of the gate electrode 26. Ohmic contact layers 55 and 56 (made of such materials as silicide or hydrogenated amorphous silicon heavily doped with impurities like phosphorus) are formed on the semiconductor layer 40.

A data wire made of conductive materials such as Mo or MoW alloy, Cr, Ta and Ti is formed on the ohmic contact layer patterns 55 and 56 and the gate insulating layer 30. The data wire has a data line 62 extending in the vertical direction in FIG. 1 and defining a pixel along with the gate line 22, a data pad 68 connected to an end of data line 62 and which transmits image signals from an external circuit to the data line 62, a source electrode 65 of a thin film transistor which is connected to the data line 62 and is extended on the ohmic contact layer 55, and a drain electrode 66 of the thin film transistor that is formed on the ohmic contact layer 56 opposite to the source electrode 65 with respect to the gate electrode 26 and separated from the source electrode 65.

The data wire parts 62, 65, 66, and 68 may have a multiple-layered structure. When the data wire has a multiple-layered structure, it is preferable that one layer is made of a material having a low resistivity and another is made of a material having good contacting properties with other materials. Double layers of Cr/Al (or Al alloy) and Al/Mo are such examples.

A passivation layer 70 of an insulating material such as SiNx is formed on the data wire parts 62, 65, 66, and 68, and the semiconductor layer 40 that is not covered by the data wire parts 62, 65, 66, and 68.

The passivation layer 70 has contact holes 76 and 78 respectively exposing the drain electrode 66 and the data pad 68, and also has (along with the gate insulating layer 30) another contact hole 74 exposing the gate pad 24. The contact holes 74 and 78 exposing the gate pad 24 and the data 68 may have various shapes with corners or rounds, and less than 2 mm×60 $\mu$m and more than 0.5 mm×15 $\mu$m of the square.

A pixel electrode 82, which receives an image signal and generates an electric field with a common electrode of an upper panel, is formed on the passivation layer 70 of the pixel. The pixel electrode 82 is connected to the drain electrode 66 both physically and electrically through the contact hole 76, and receives the image signal from the drain electrode 66. A redundant gate pad 86 and a redundant data pad 88, respectively connected to the gate pad 24 and to the data pad 68 through the contact holes 74 and 78, are formed on the passivation layer 70. Here, the pixel electrode 82, and the gate and data pad 86 and 88 are made of IZO.

This thin film transistor array panel according to the first embodiment of the present invention has a contact structure of the gate pad 24 including aluminum, and the redundant gate pad 86 of IZO. At this time, it is preferable that the contact resistance of the contact structure may less than 10% of wire resistance of the gate wire 22, 24 and 26, and 0.15 $\mu\Omega cm^2$. In a 14.1 inch liquid crystal display, is designed to be in the range of 0.05–0.1 $\mu\Omega cm^2$.

Here, as shown in FIGS. 1 and 2, the pixel electrode 82 overlaps the gate lines 22 to make a storage capacitor. If there is not enough storage capacitance with this configuration, an additional storage wire may be formed of the same layer as the gate wire parts 22, 24, and 26. Also, the IZO pattern 82, 86, 88 may be formed before the passivation layer 70 or the data wire 62, 65, 66 and 68.

With the structure of the thin film transistor array panel according to present invention, by forming the wire of aluminum and aluminum alloy, the delay and distortion of signals may be prevented in large scale LCDs. Also, a pad portion is made of conductive materials having a low contact resistance and corrosion of a wire made of aluminum or aluminum alloy is prevented, therefore a reliable pad portion may be obtained.

A manufacturing method of a thin film transistor array panel according to a first embodiment of the present invention will now be described with reference to the FIGS. 3A to 6B and FIGS. 1 to 2.

Figure 3A:
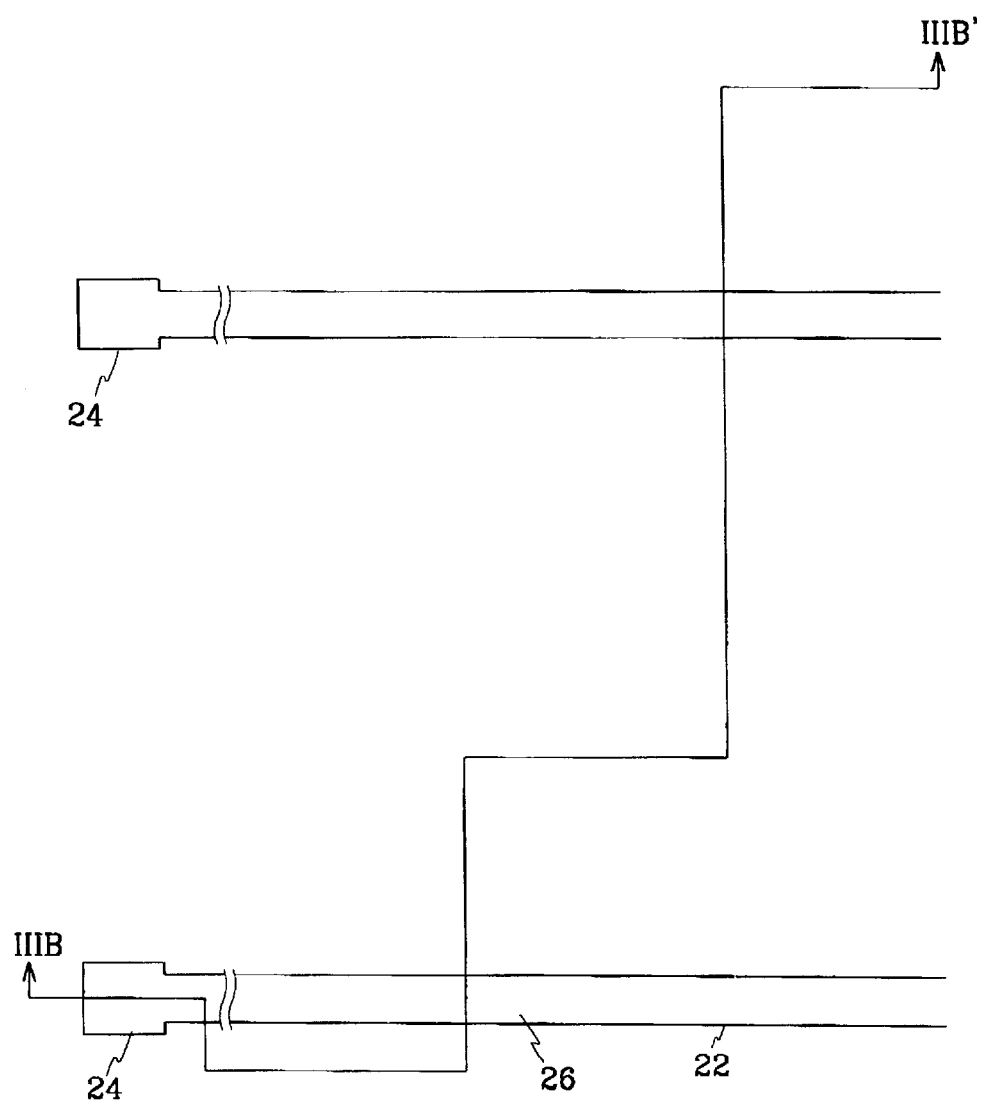
FIGS. 3A, 4A, 5A and 6A are layout views of the thin film transistor array panel according to the first embodiment of the present invention at middle manufacturing steps of a manufacturing method.
Figure 3B:
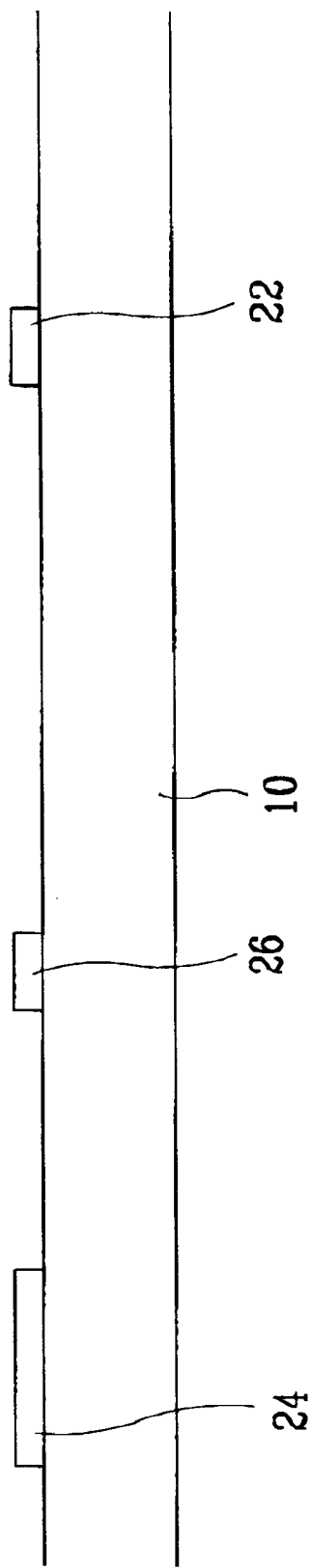
FIG. 3B is cross-sectional view taken along the line IIIB-IIIB' of FIG. 3A.

At first, as shown in FIGS. 3A and 3B, a conductive layer having a low resistivity such as aluminum or aluminum alloy is deposited and patterned. Preferably, in this embodiment, a target of Al—Nd alloy including 2 at % (atomic percentage) of Nd was sputtered at a temperature of about 150° C. to form the conductive layer at a thickness of about 2,500 Å on the substrate 10, then the conductive layer is patterned to form gate wire parts including a gate line 22, a gate electrode 26, and a gate pad 24 by dry or wet etching the conductive layer through a photolithography process.

Figure 4A:
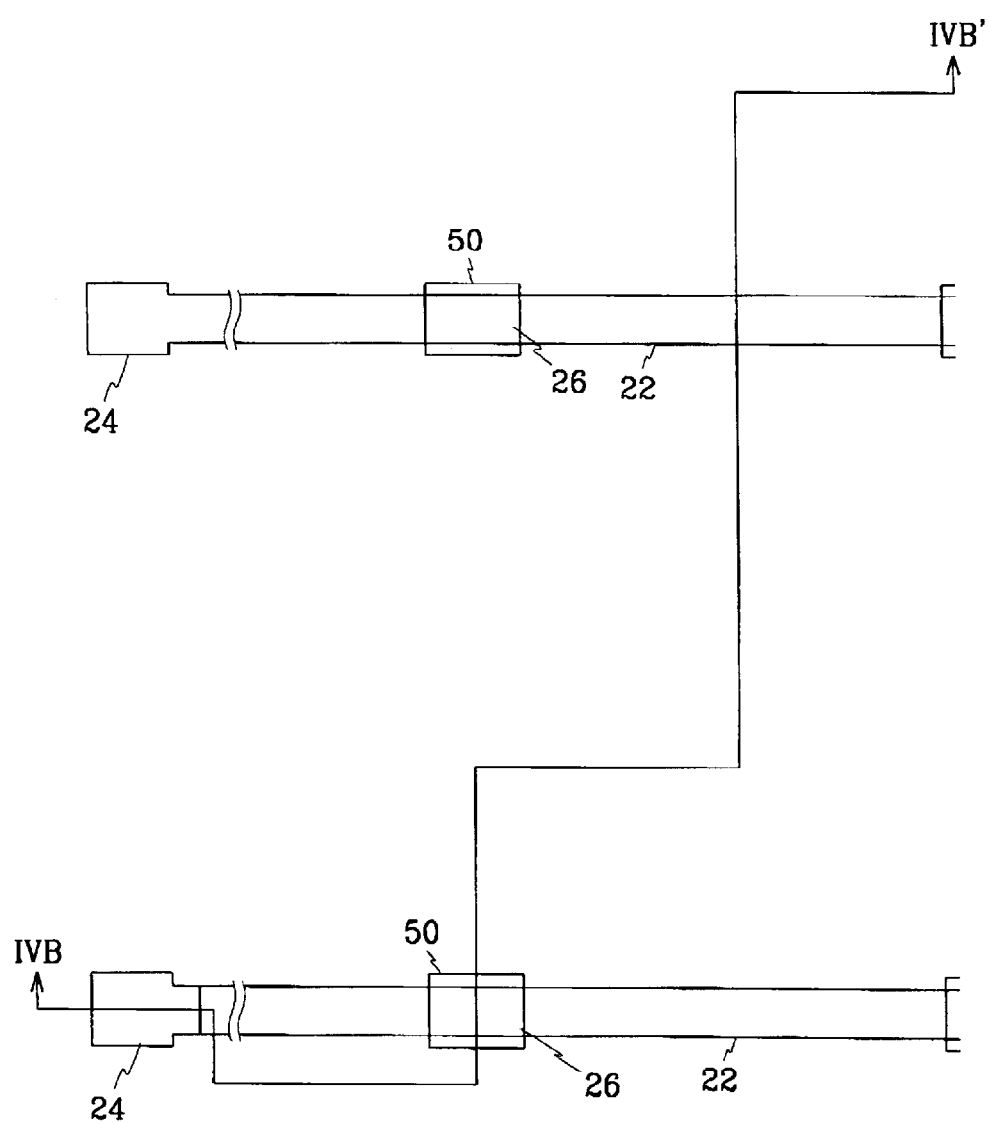
Figure 4B:
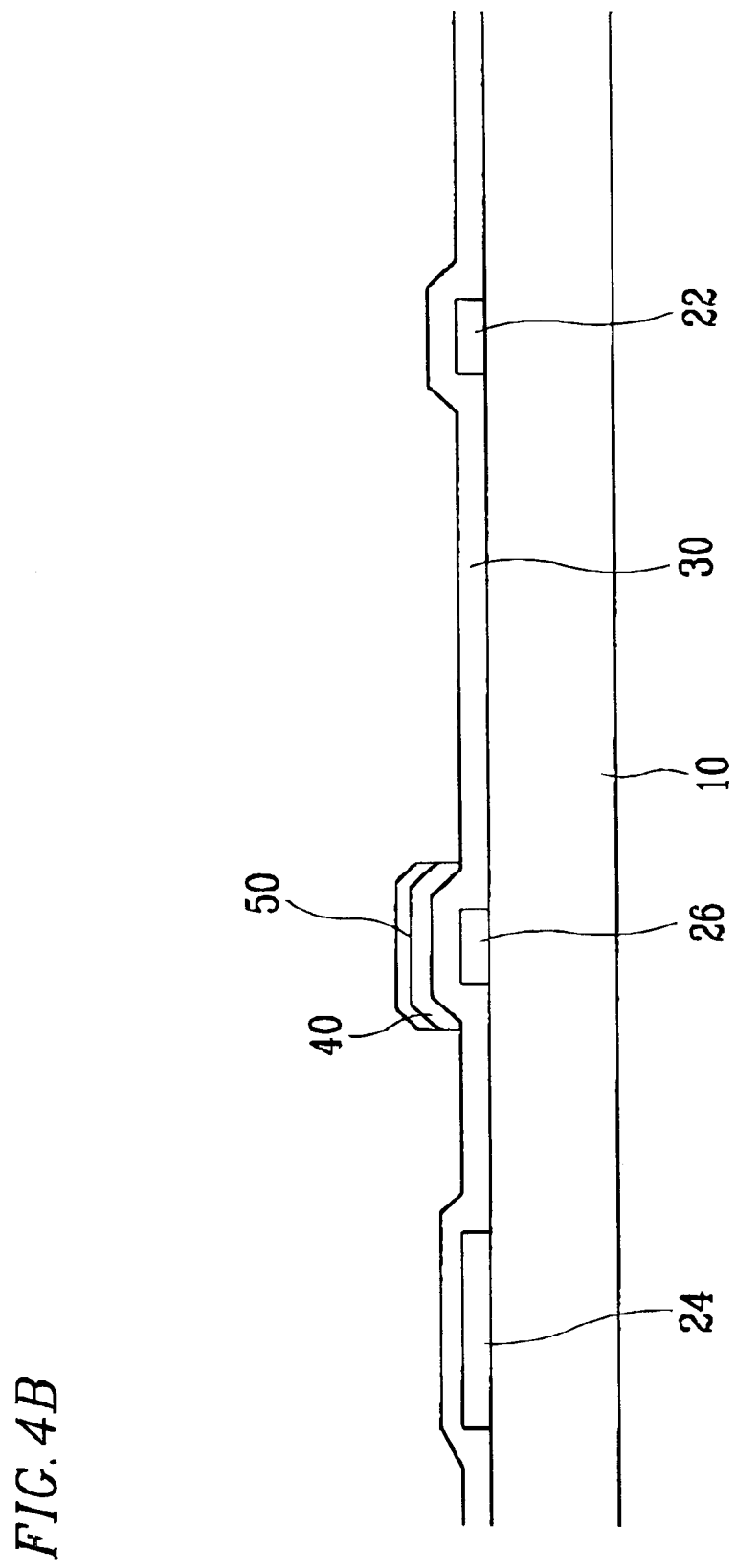
FIG. 4B is cross-sectional view taken along the line IVB-IVB' of FIG. 4A at the next manufacturing step following that represented in FIG. 3B.

Next, as shown in FIGS. 4A and 4B, a gate insulating layer 30, an amorphous silicon semiconductor layer 40, and a doped amorphous silicon ohmic contact layer 50 are sequentially layered. Then, the semiconductor layer 40 and ohmic contact layer 50, which are both island shaped, are formed on top of the gate electrode 26 and the opposing gate insulating layer 30 using a mask patterning process. Here, it is preferable that a silicon-nitride (SiNx) is deposited to a thickness of about 4,500 Å at a temperature of about 370° C. in range of more than 300° C. and for more than 5 minutes to form the gate insulating layer 30. When depositing the gate insulating layer 30, all or part of aluminum oxide (AlO$_x$) layer having a high resistivity, which is remained on the gate wire 22, 24 and 26, may be removed. Also, plasma including argon, helium or hydrogen with in-situ as a cleaning process may be executed before forming the gate insulating layer 30, to prevent AlO$_x$ from forming on the metal layer 22, 24 and 26 of aluminum-based material.

Figure 5A:
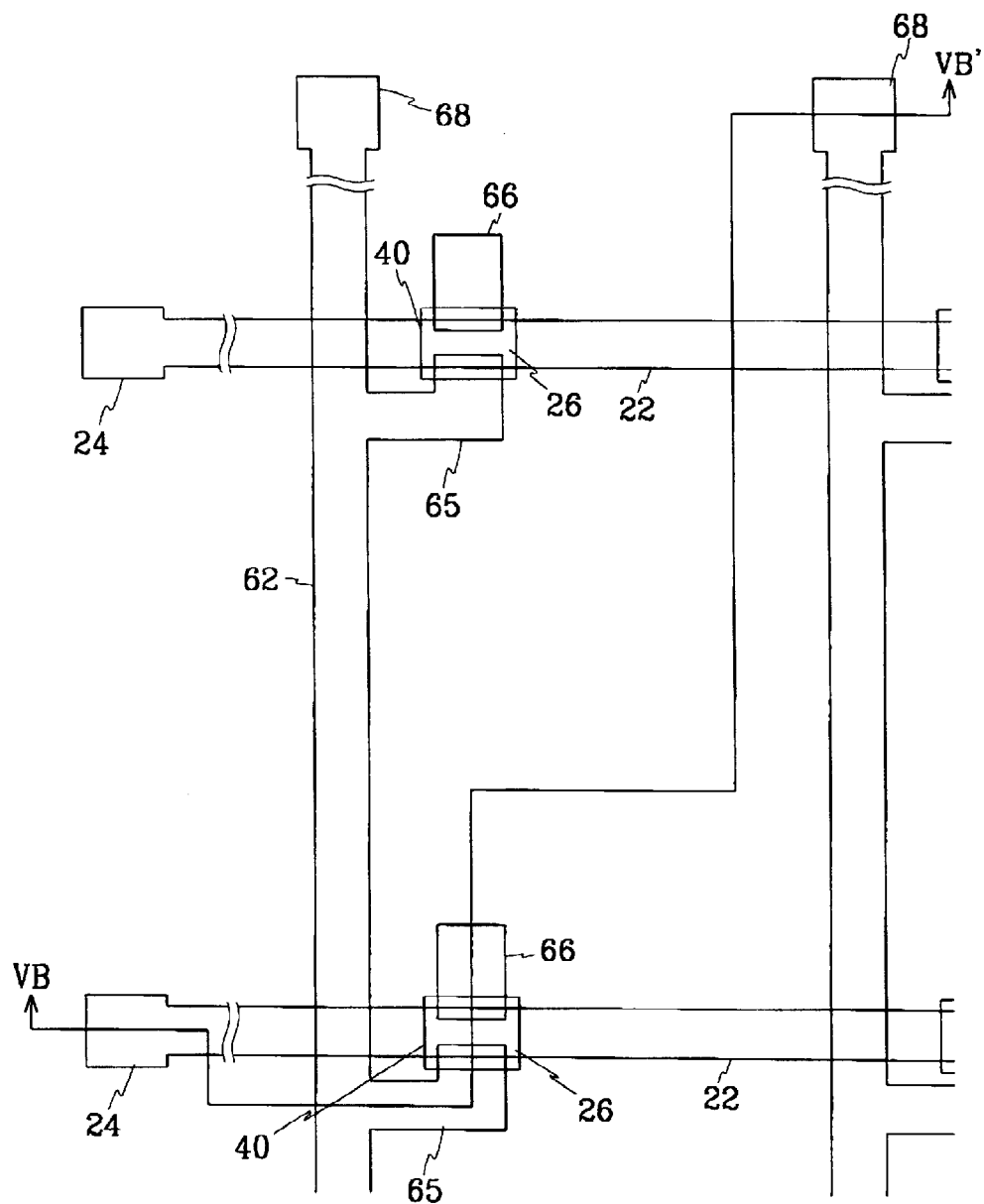
Figure 5B:
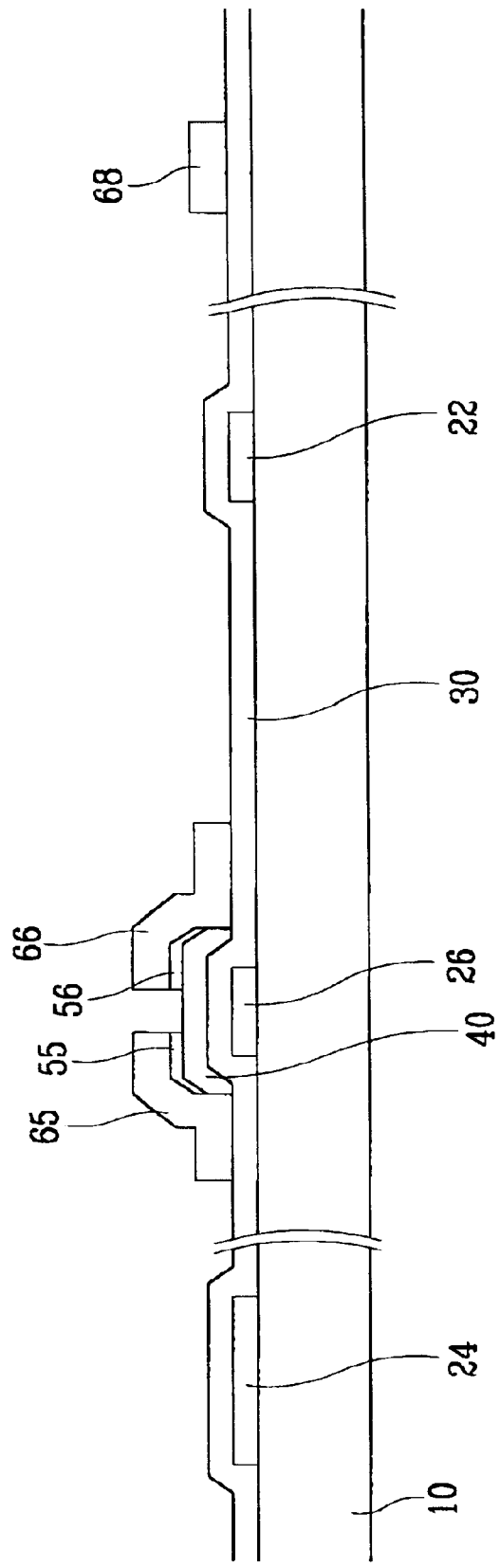
FIG. 5B is cross-sectional view taken along the line VB-VB' of FIG. 5A at the next manufacturing step following that represented in FIG. 4B.

Then, as shown in FIGS. 5A and 5B, a conductor layer such as chromium, molybdenum, molybdenum alloy, titanium or tantalum is deposited by such methods as sputtering and patterned through a photolithography process using a mask to form a data wire including a data line 62 intersecting the gate line 22, a source electrode 65 connected to the data line 62 and extended over the gate electrode 26, a drain electrode 66 separated from the source electrode 65 and opposite to the source electrode 65 with respect to the gate electrode 22, and a data pad 68 connected to the end of the data line 62.

Then, the ohmic contact layer 50 is etched by using the data wires 62, 65, 66, and 68 as a mask and a plasma dry etch to divide the ohmic contact layer 50 with the center of the gate electrode 26, and to expose the central portion of the amorphous silicon layer 40 between the ohmic contact layers 55 and 56. Oxygen plasma may be executed to stabilize the surface of the amorphous silicon layer 40.

Figure 6A:
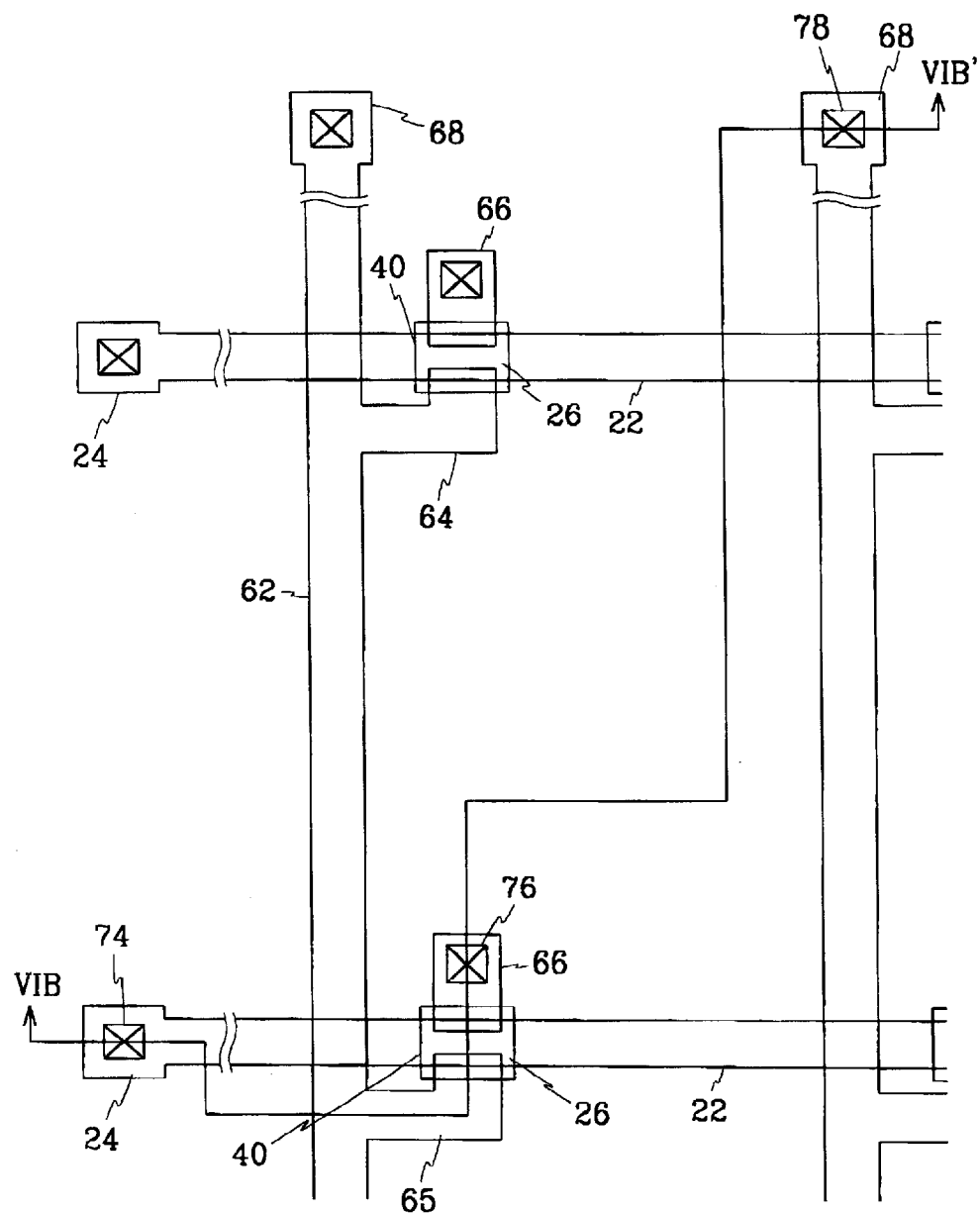
Figure 6B:
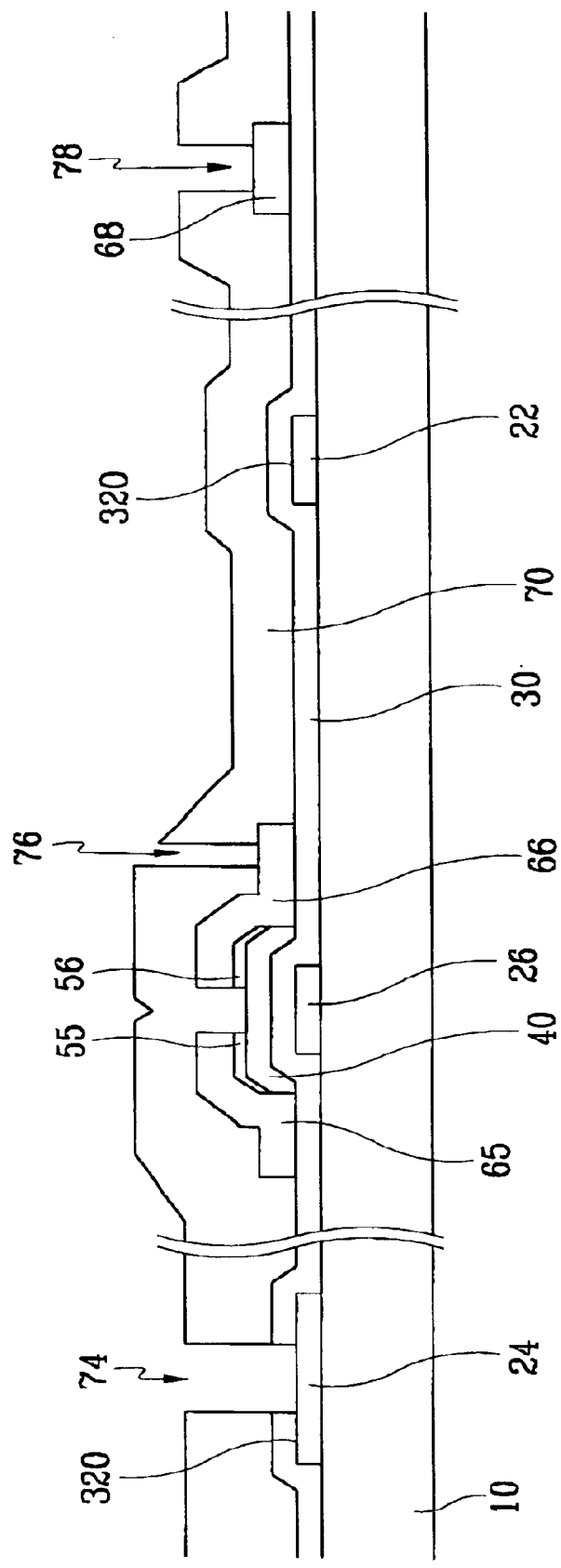
FIG. 6B is cross-sectional view taken along the line VIB-VIB' of FIG. 6A at the next manufacturing step following that represented in FIG. 5B.

After forming data wire parts 62, 65, 66, and 68 by the above steps, a passivation layer 70 is formed by depositing an inorganic insulator such as silicon-nitride (SiNx), as shown in FIGS. 6A and 6B. At this time, the passivation layer 70 is deposited at a thickness of about 2,000 Å.

When depositing the passivation layer 70, all or part of aluminum oxide (AlO$_x$) layer having high resistivity, remaining on the gate wire 22, 24 and 26 during manufacturing process, may be removed and a reaction layer having a low resistivity may be formed. Of course, when forming the data wire 62, 65, 66 and 68 of a metal layer of aluminum-based material, the same effects may be obtained. Then, contact holes 74, 76, and 78 respectively exposing the gate pad 24, the drain electrode 66, and the data pad 68 are formed by etching the passivation layer 70 and the gate insulating layer 30. At this time, the contact holes 74, 76, 78 may have a various shape having corners or rounds, and it is desirable that the square of the contact holes 74 and 78, which expose the pads 24 and 68, are less than 2 mm×60 $\mu$m and more than 0.5 mm×15 $\mu$m.

Next, as shown in FIGS. 1 to 2, an IZO layer is deposited to a thickness of about 500 Å and etched by photolithography using a mask to form a pixel electrode 82, a redundant gate pad 86 and a redundant data pad 88 connected to the drain electrode 66, the gate pad 24 and the data pad 68 through the contact holes 76, 74 and 78, respectively. Before depositing the IZO layer, pre-heating process may be executed. Inert gas of nitrogen may be used, during the pre-heating process to prevent metal oxide layer from forming on the metal layer 24, 66 and 68 exposed through the contact holes 74, 76 and 78. In this embodiment according to the present invention, in order to minimize the contact resistance of contact portion, the IZO layer is preferably deposited in the range of less than 200° C., and the IZO thin film is formed through sputtering a process by using the target including $In_2O_3$ and ZnO. The compound of $In_2O_3$ and ZnO comprises 15–20 at % (atomic percentage) of Zn. In this embodiment, IDIXO (indium x-metal oxide) produced by Idemitsu Company is used as an IZO target to form the IZO layers 82, 86 and 88. Also, in-situ plasma using argon, helium or hydrogen may be executed before forming the IZO layer as a cleaning process, to prevent $AlO_X$ from forming on the metal layer 24 of aluminum-based material.

In the manufacturing method according to the embodiment of the present invention, annealing processes may be performed when forming the insulating layers 30 and 70, in order to improve contact properties between the IZO and metal of aluminum-based material. The annealing processes increase the reliability of the contact portions by minimizing the contact resistance of the contact portions including the pad portions.

In the first embodiment, the thin film transistor array panel is manufactured by a photolithography process using five photomasks, but a thin film transistor array panel may be manufactured by a photolithography process using four photomasks, and this will be described with reference to FIGS. 7 to 9.

Figure 7:
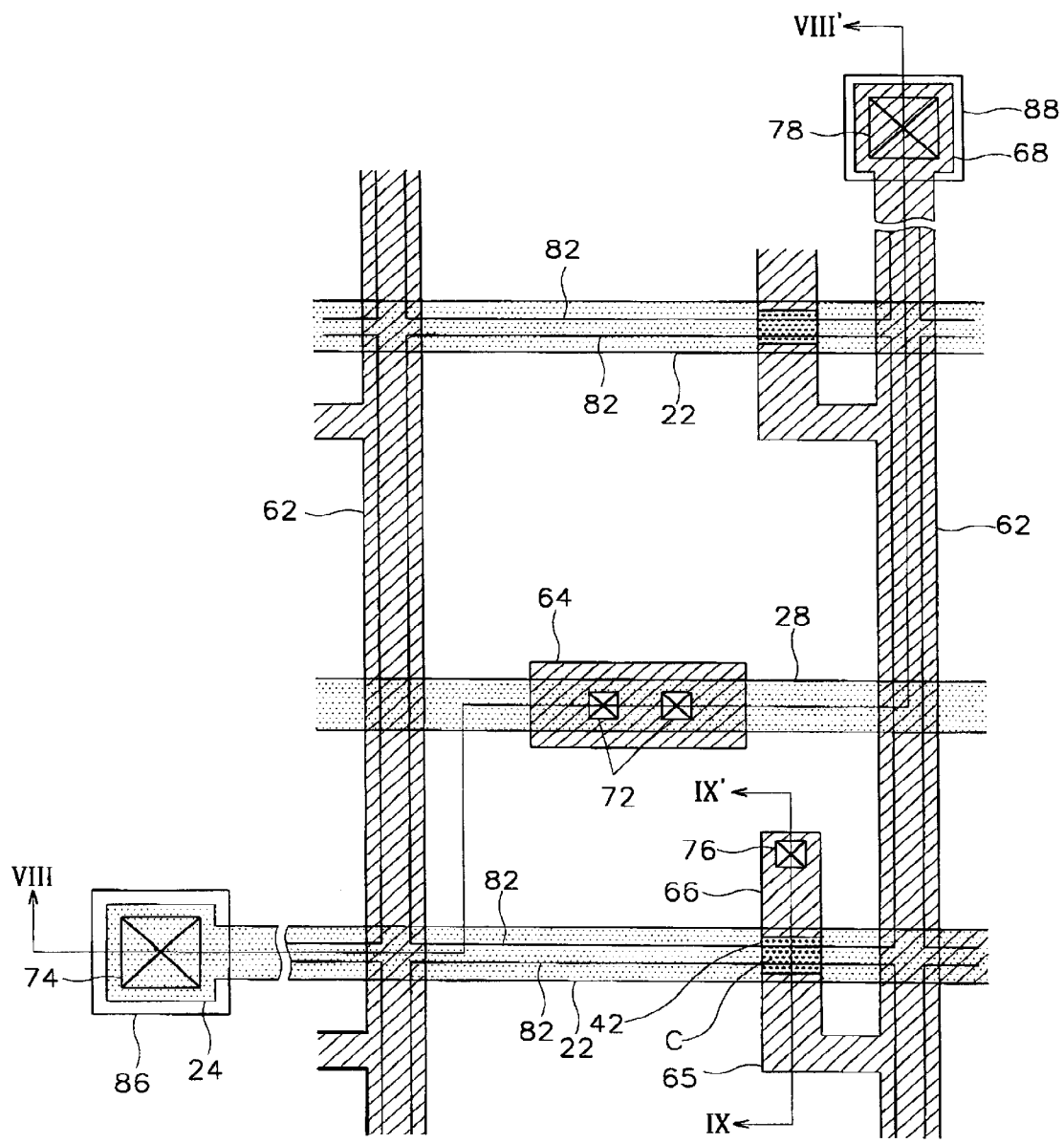
FIG. 7 is a layout view of a thin film transistor array panel for a liquid crystal display according to the second embodiment of the present invention.
Figure 8:
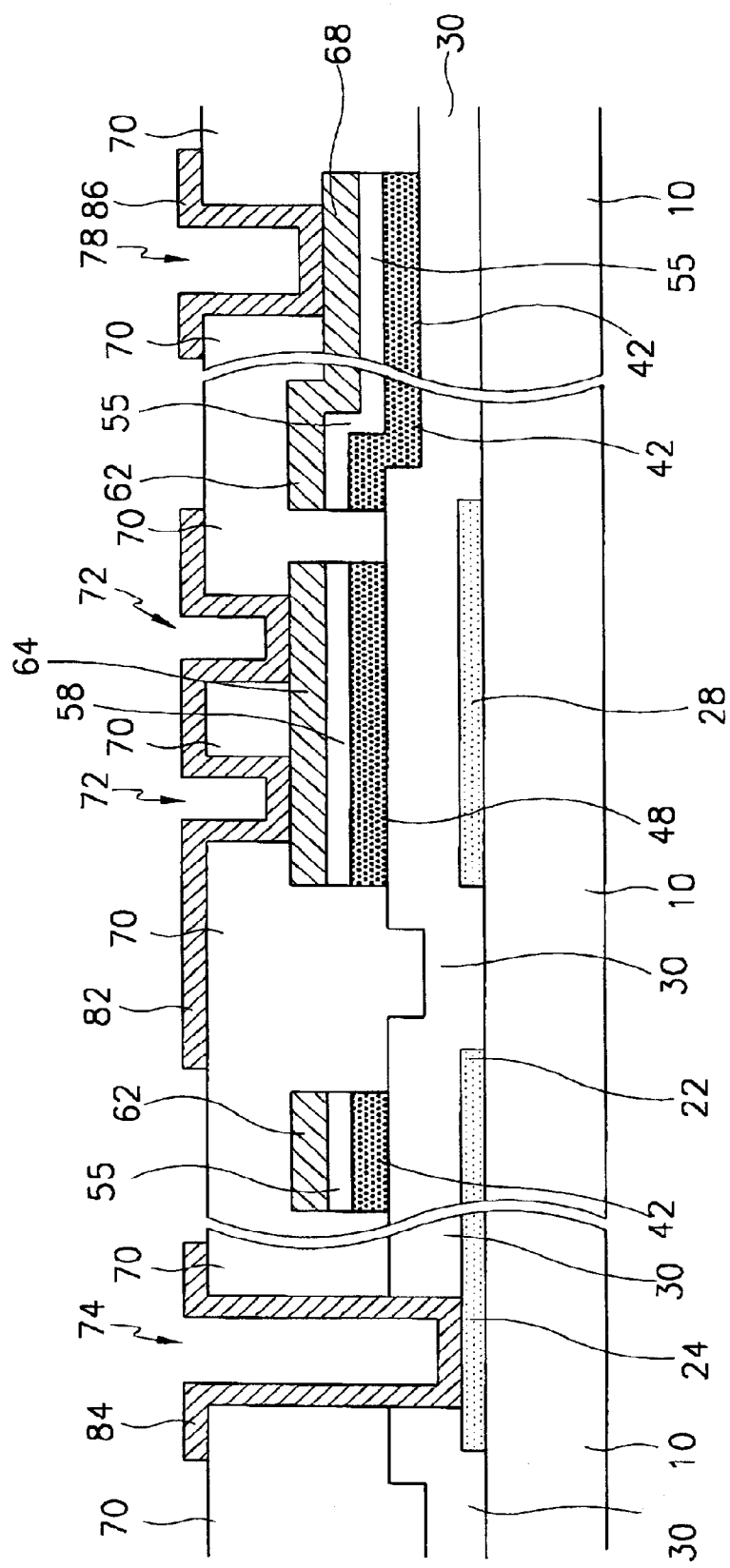
FIGS. 8 and 9 are cross-sectional views taken along lines VIII-VIII' and IX-IX' of FIG. 7, respectively.
Figure 9:
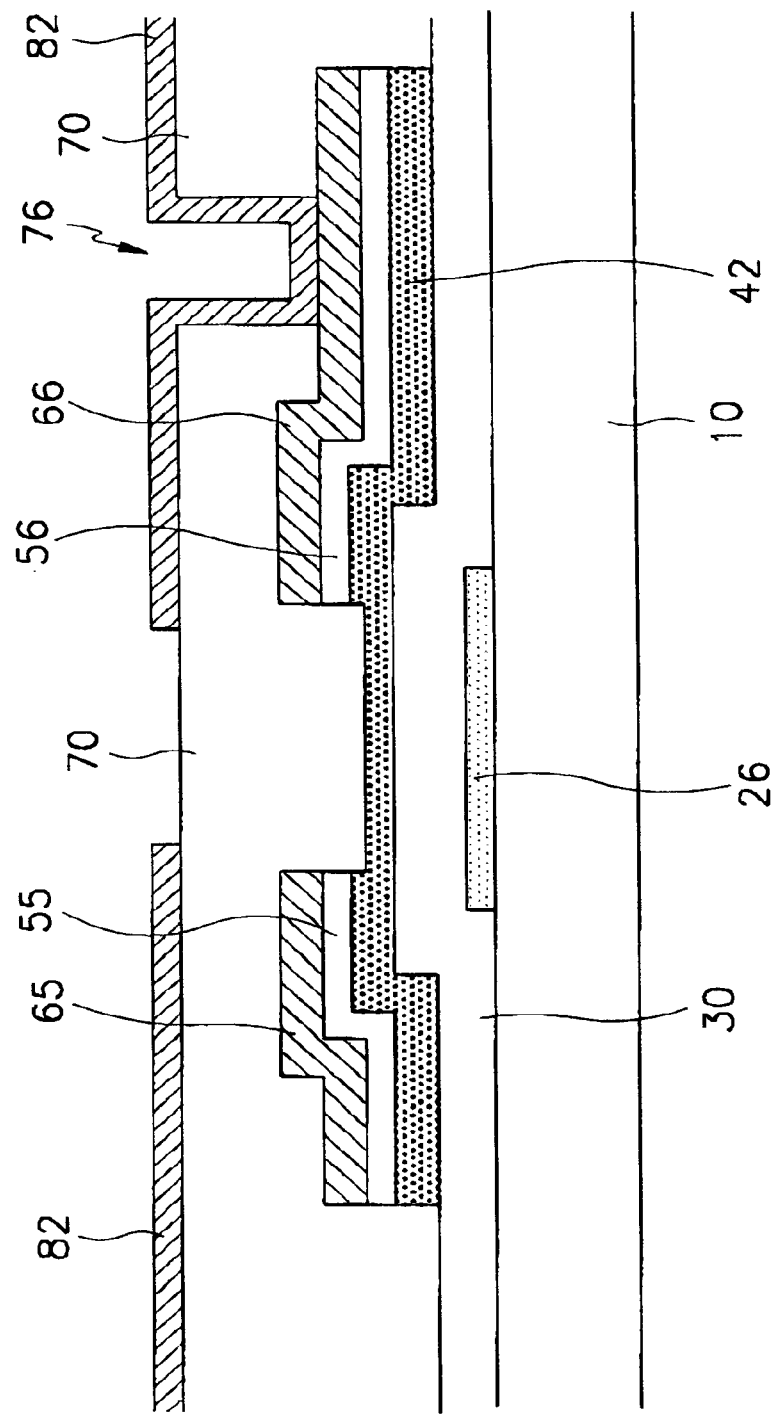

FIG. 7 is a layout view of a thin film transistor array panel for a liquid crystal display according to the second embodiment of the present invention, and FIGS. 8 and 9 are the cross-sectional views taken along lines XIII-XIII' and IX-IX' of FIG. 7.

Gate wires made of metal or conductive material such as aluminum (Al) or aluminum alloy and including a gate line 22, a gate pad 24 and a gate electrode 26, like the first embodiment, are formed on an insulating substrate 10. Also, the gate wires includes a storage electrode 28 that is formed parallel with the gate line 22 and receives a voltage such as a common voltage applied to a common electrode (not shown) on an upper panel of the liquid crystal display. The storage electrode 28 provides storage capacitance along with a conductor pattern 68 connected to a pixel electrode 82 that will be described later. The liquid crystal capacitor includes the pixel electrode 82 and the common electrode. The storage electrode 28 may not be provided if the storage capacitance between the pixel electrode 82 and the gate line 22 is sufficient.

Gate insulating layers 30 of silicon-nitride (SiNx) are formed on the insulating substrate 10, and covers the gate wire parts 22, 24, 26, and 28.

Semiconductor patterns 42 and 48 (made of semiconductor such as hydrogenated amorphous silicon) are formed on the gate insulating layer 30. Ohmic contact layer patterns 55, 56, and 58 (made of such materials as doped amorphous silicon heavily doped with impurities like phosphorus) are formed on the semiconductor patterns 42 and 48.

A data wire made of conductive materials such as Mo or Mo alloy, Cr, Ti and Ta is formed on the ohmic contact layer patterns 55, 56, and 58. The data wire has a data line part including a data line 62 extending in the vertical direction on FIG. 7, a data pad 68 connected to an end of data line 62 and transmitting image signals from an external circuit to the data line 62 and a source electrode 65 of a thin film transistor connected to data line 62. The data wire also includes a drain electrode 66 of the thin film transistor on the other side of the gate electrode 26 or the channel part C of a thin film transistor and is separated from the data line parts 62, 64, 65, and conductor pattern 64 used for storage capacitance located on the storage electrode 28. When the storage electrode 28 is not provided, neither is the conductor pattern 64.

The data wire parts 62, 64, 65, 66, and 68 may have a multiple-layered structure. Of course, when the data wire has a double-layered structure, it is preferable that one layer is made of a material such as aluminum or aluminum alloy and another layer is made of a material such as Mo or Mo alloy, Cr, Ti and Ta.

The ohmic contact layer patterns 55, 56, and 58 reduce the contact resistance between the semiconductor patterns 42 and 48 and the corresponding data wire parts 62, 64, 65, 66, and 68, and have the same layout as the data wire parts 62, 64, 65, 66, and 68. In other word, a first ohmic contact layer portion 55 under the data line part has the same shape as the data line parts 62, 68, and 65, a second ohmic contact layer portion 56 under the drain electrode part has the same shape as the drain electrode 66, and a third ohmic contact layer portion 58 under the conductor pattern 64 has the same shape as the conductor pattern 64 for the storage capacitor.

The semiconductor patterns 42 and 48 except for the channel part C of the thin film transistor have the same layout as the corresponding data wire parts 62, 64, 65, 66, and 68 and the corresponding ohmic contact layer patterns 55, 56, and 58. Or, more concretely, the semiconductor portion 48, the conductor pattern 64, and the third ohmic contact layer portion 58 all have the same shape, but the semiconductor portion 42 has a different shape from the data wire and the ohmic contact layer pattern. In other words, the data line parts 62, 68, and 65, especially the source electrode 65 and the drain electrode 66, are separated from each other by the channel part C of thin film transistor and the portions 55 and 56 of ohmic contact layer pattern thereunder are also separated from each other, but the semiconductor portion 42 is not divided into two pieces so that it traverses the channel of a thin film transistor.

A passivation layer 70 made of nitride silicon is formed on the data wire parts 62, 64, 65, 66, and 68.

The passivation layer 70 have contact holes 76, 74, 78, and 72 respectively exposing the drain electrode 66, the gate pad 24, the data pad 68, and the conductor pattern 64 provided for storage capacitance.

Pixel electrodes 82 that receive an image signal and generate an electric field with a common electrode of an upper panel are formed on the passivation layer. The pixel electrode 82 is made of a transparent conductive material such as indium tin oxide (IZO). The pixel electrode 82 is connected to the drain electrode 66 both physically and electrically through the contact hole 76, and receives the image signal from the drain electrode. Even though the aperture ratio is increased when the pixel electrode 82 overlaps the gate lines 22 or the adjacent the data lines 62, these lines are not required to overlap the pixel electrode. The pixel electrode 82 is connected to the conductor pattern 64 for storage capacitance through the contact hole 72 and transmits an image signal to the conductor pattern 64.

A redundant gate pad 86 and a redundant data pad 88 are formed on the gate pad 24 and the data pad 68 respectively connected to them through the contact hole 74 and the contact hole 78. These redundant pads 86 and 88 are optional as they protect the pads 24 and 68 and supplement the adhesiveness between an external circuit and the pads 24 and 68.

A method for manufacturing a thin film transistor array panel according to an embodiment of the present invention will now be described with reference to the FIGS. 10A to 17C and FIGS. 7 to 9.

Figure 10A:
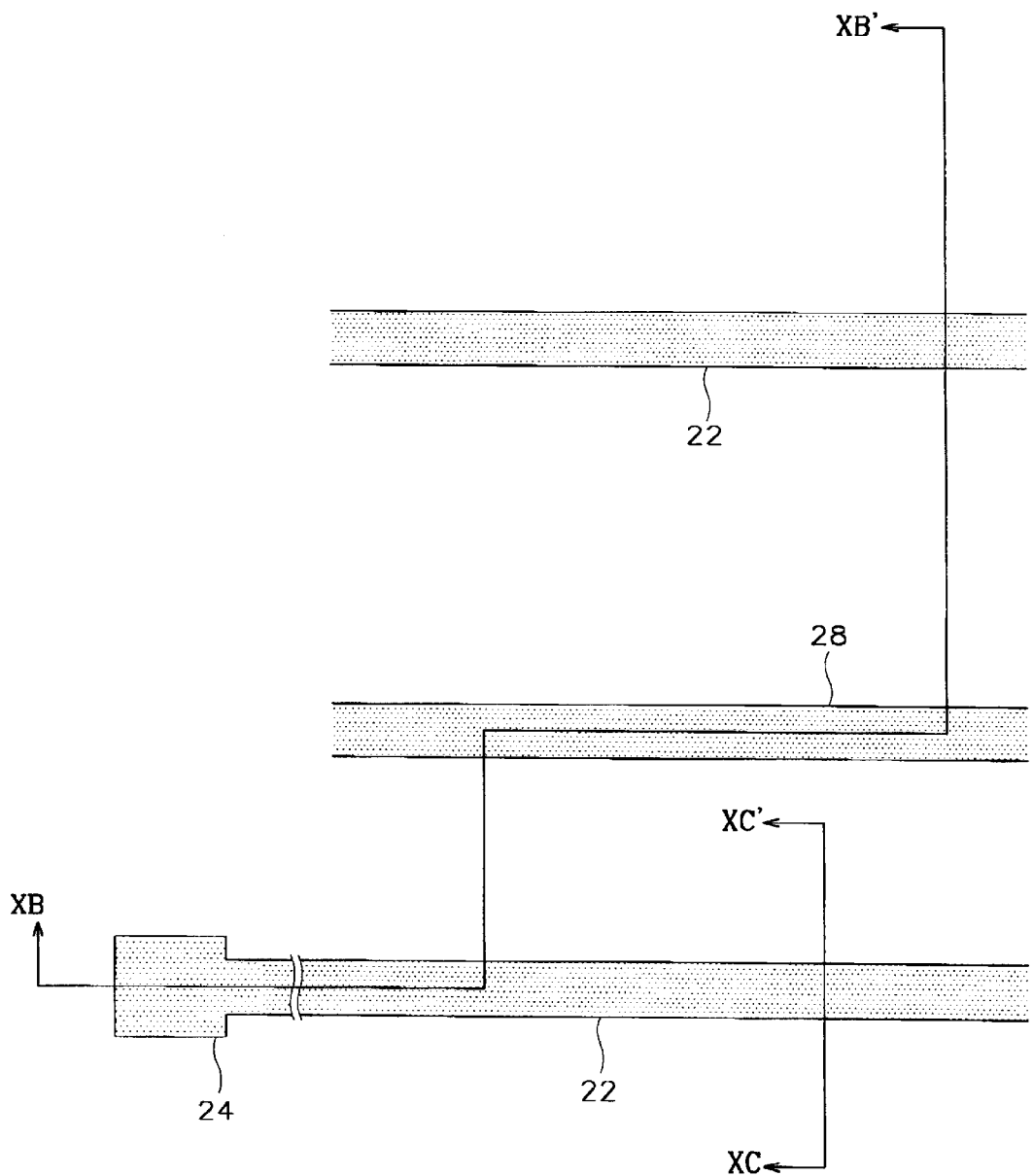
FIG. 10A is a layout view of the thin film transistor array panel according to the second embodiment of the present invention at a first manufacturing step of a manufacturing method.
Figure 10B:
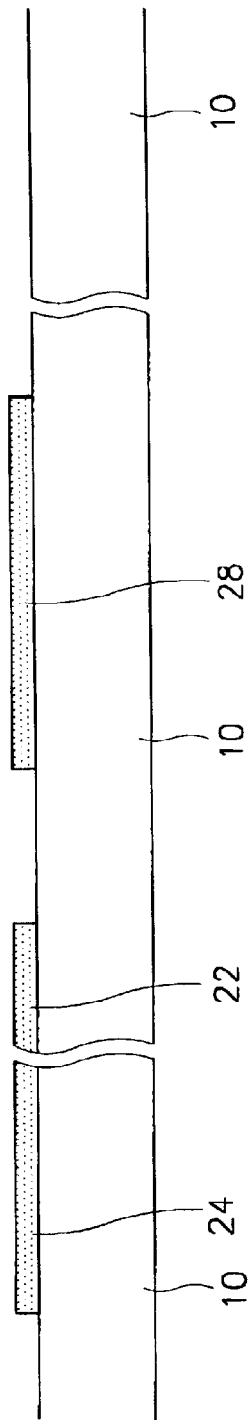
FIGS. 10B and 10C are cross-sectional views taken along the lines XB-XB' and XC-XC' of FIG. 10A.
Figure 10C:
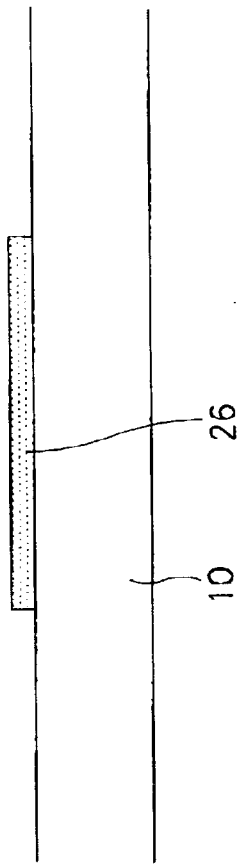

At first, as shown in FIGS. 10A to 10C, a conductive layer having a low resistivity such as aluminum or aluminum alloy is deposited and patterned, such as the first embodiment. Preferably, in this embodiment, a target of Al-Nd alloy including 2 at % (atomic percentage) of Nd was sputtered at a temperature of about 150° C. to form a conductive layer to a thickness of about 2,500 Å on the substrate 10. Then, the conductive layer is patterned to form gate wire parts including a gate line 22, a gate electrode 26, a gate pad 24, and a storage electrode 28 by dry or wet etching the conductive layer through a photolithography process.

Figure 11A:
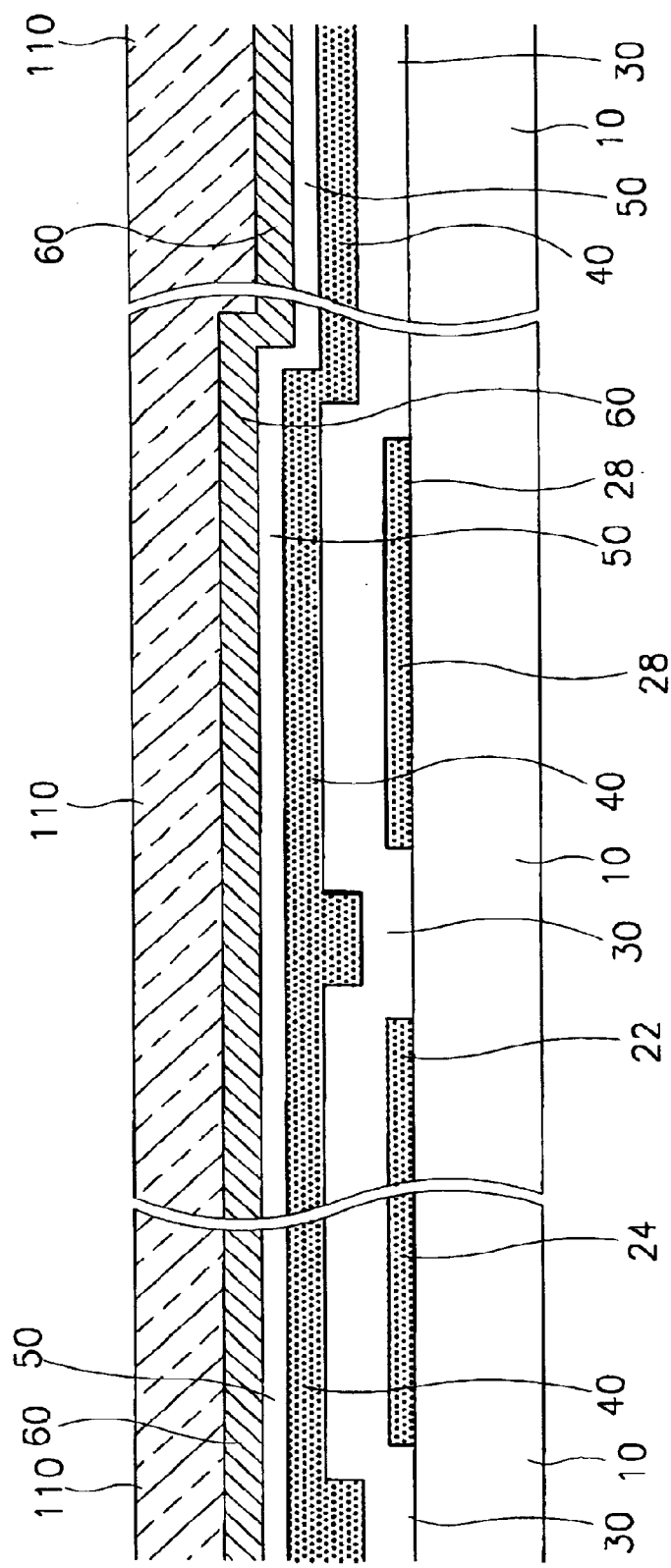
FIGS. 11A and 11B are cross-sectional views at the next manufacturing step following that represented in FIGS. 10B and 10C taken along the lines XB-XB' and XC-XC' of FIG. 10A.
Figure 11B:
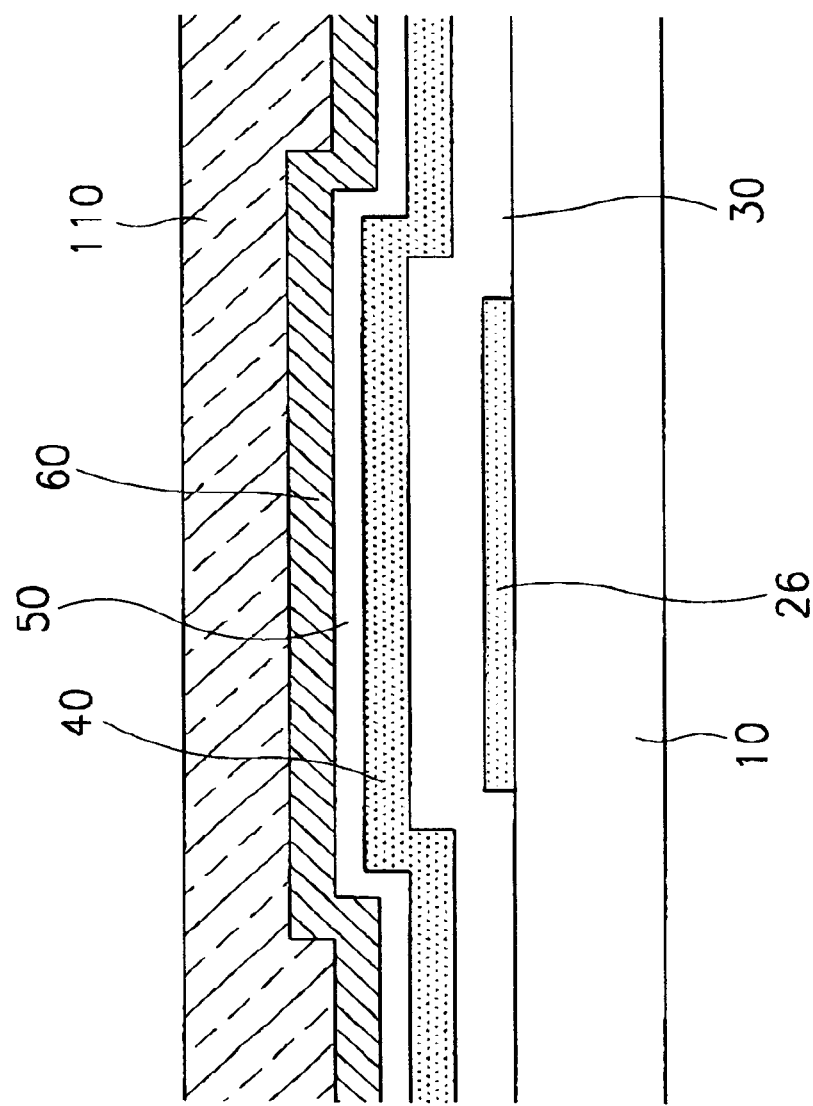

Next, as shown in FIGS. 11A and 11B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering and a photoresist layer 110 having a thickness of 1 µm to 2 µm is coated on the conductive layer 60. Also, it is preferable that the gate insulating layer 30 of silicon-nitride is deposited at a temperature of about 370° C. to a thickness of about 4,500 Å for more than 5 minutes. When depositing the gate insulating layer 30, all or part of aluminum oxide ($AlO_x$) layer having a high resistivity, which may remain on the gate wire 22, 24 and 26, may be removed. Also, in-situ plasma using argon, helium or hydrogen may be performed as a cleaning process before forming the gate insulating layer 30, to prevent $AlO_x$ from forming on the metal layer 22, 24 and 26 of aluminum-based material.

Figure 12A:
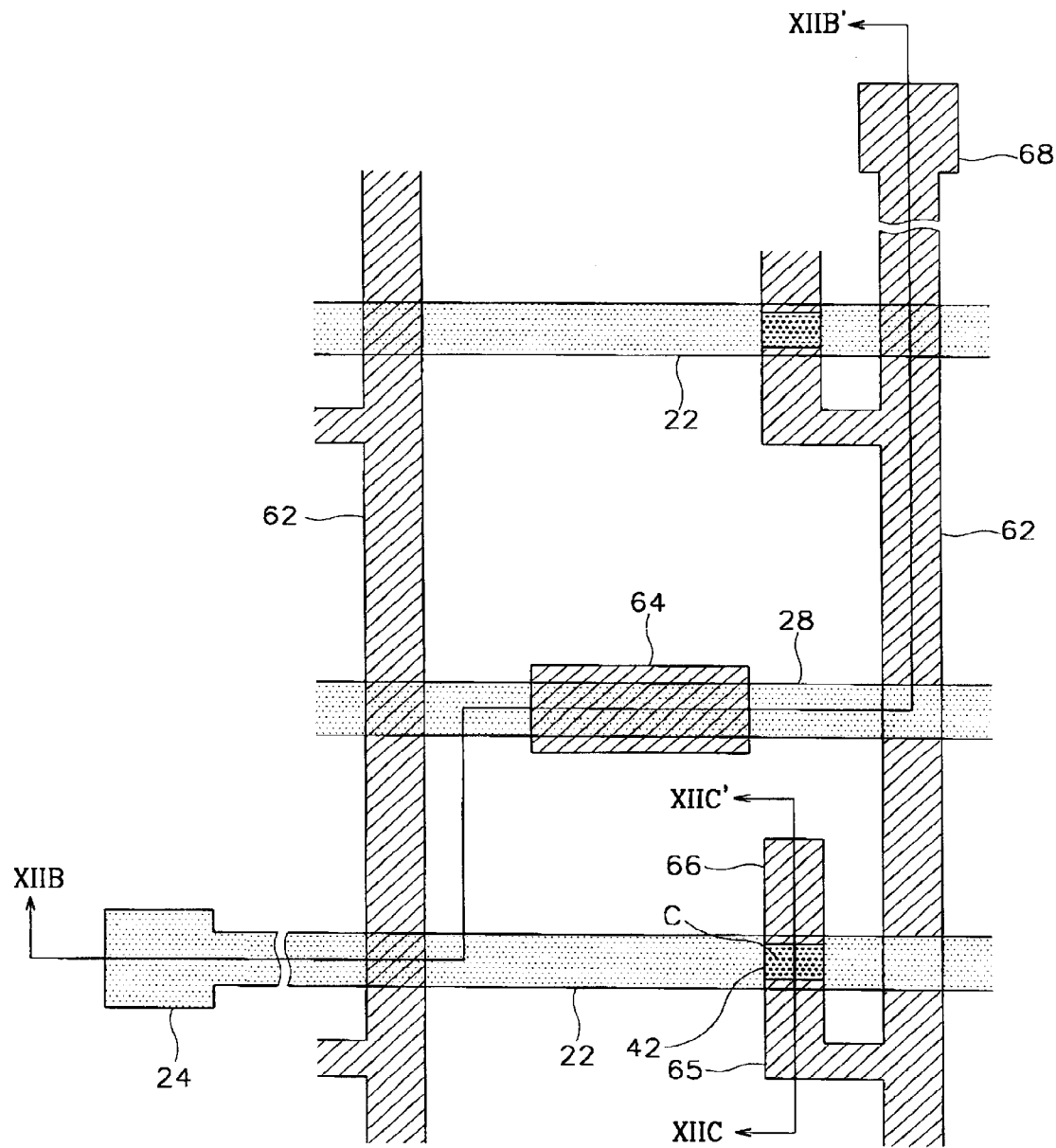
FIG. 12A is a layout view of thin film transistor array panel in the next manufacturing step following that represented in FIGS. 11A and 11B.
Figure 12B:
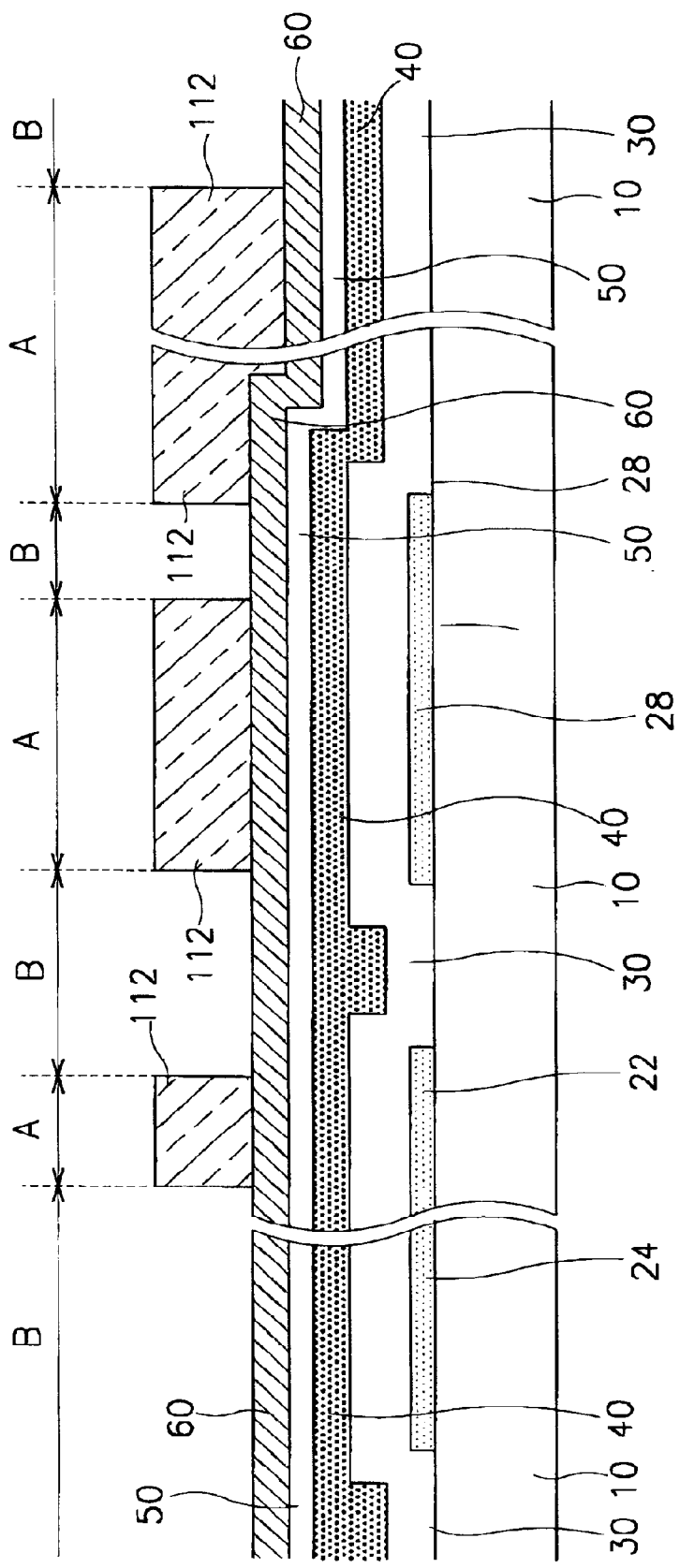

Thereafter, the photoresist layer 110 is exposed to light through a second mask and developed to form photoresist patterns 112 and 114 as shown in FIGS. 12B and 12C. At this time, the first portion 114 of the photoresist pattern located between a source electrode 65 and a drain electrode 66, i.e., a thin film transistor channel part C as shown in FIG. 12C, is thinner than the second portion 112 of photoresist pattern located over the data wire portion A where a data wire parts 62, 64, 65, 66, and 68 will be formed. Additionally, the third portion, or the remaining portion of the photoresist pattern located at portion B, is thinner than the first portion. The third portion may have a thickness that varies according to the etching method. For example, the third portion has substantially zero thickness when using a wet etch, but the third portion may have a non-zero thickness when using a dry etch. At this time, the thickness ratio between the first portion 114 and the second portion 112 depends on the etch conditions that will be described later. However, it is preferable that the thickness of the first portion 114 is equal to or less than half of that of the second portion 112, or for example, less than 4,000 Å.

There are many methods to have the thickness of the photoresist layer vary according to position, and it is possible to control the amount of incident light of a portion by forming a pattern such as a slit or a lattice, or by providing a partly-transparent layer on the mask.

At this time, it is desirable that the size of the slit and the opaque portion between the slits are smaller than the resolution of the exposure device. When a partly-transparent layer is used, to reduce the amount of exposing light, a mask including films having different transmittances, or having a various thickness may be used.

When the photoresist layer is exposed to light through this mask, the polymers of the photoresist layer are disintegrated by the light. The exposure step is finished when the polymers of a portion, which is directly exposed to the light, are completely disintegrated. However, the polymers of the photoresist layer portion that are exposed through the slit patterns are not completely disintegrated because the amount of incident light is less than that of the directly exposed portion. The polymers of the photoresist layer portion, which are not exposed to light by blocking layer, are hardly disintegrated. After developing the photoresist layers, the non-exposed photoresist layer portion mostly remain. A thinner portion is remained under the portion exposed to lesser amount of light than the portion that received full exposure. However, if the exposure time is too long, all the polymers of the photoresist layer are disintegrated. Therefore, the exposure time should be closely controlled.

The thinner portion 114 may be formed by forming a photoresist layer made of photosensitive and reflowable material, exposing the photoresist layer to light through a mask having respectively substantially transparent portions and substantially opaque portions to form a photoresist pattern having portions of zero and nonzero thicknesseses, and reflowing the photoresist to flow into the zero thickness portions to form a new photoresist pattern.

Referring back to FIG. 12C, the photoresist pattern 114 and the layers thereunder including the conductor layer 60, the ohmic contact layer 50, and the semiconductor layer 40 are next subject to an etching process. When this is done, a data wire and the underlying layers at the data wire part A may be left, as well as only the semiconductor layer on the channel part C. In addition, three layers 60, 50, and 40 in the remaining part B are removed from the gate insulating layer 30.

Figure 13A:
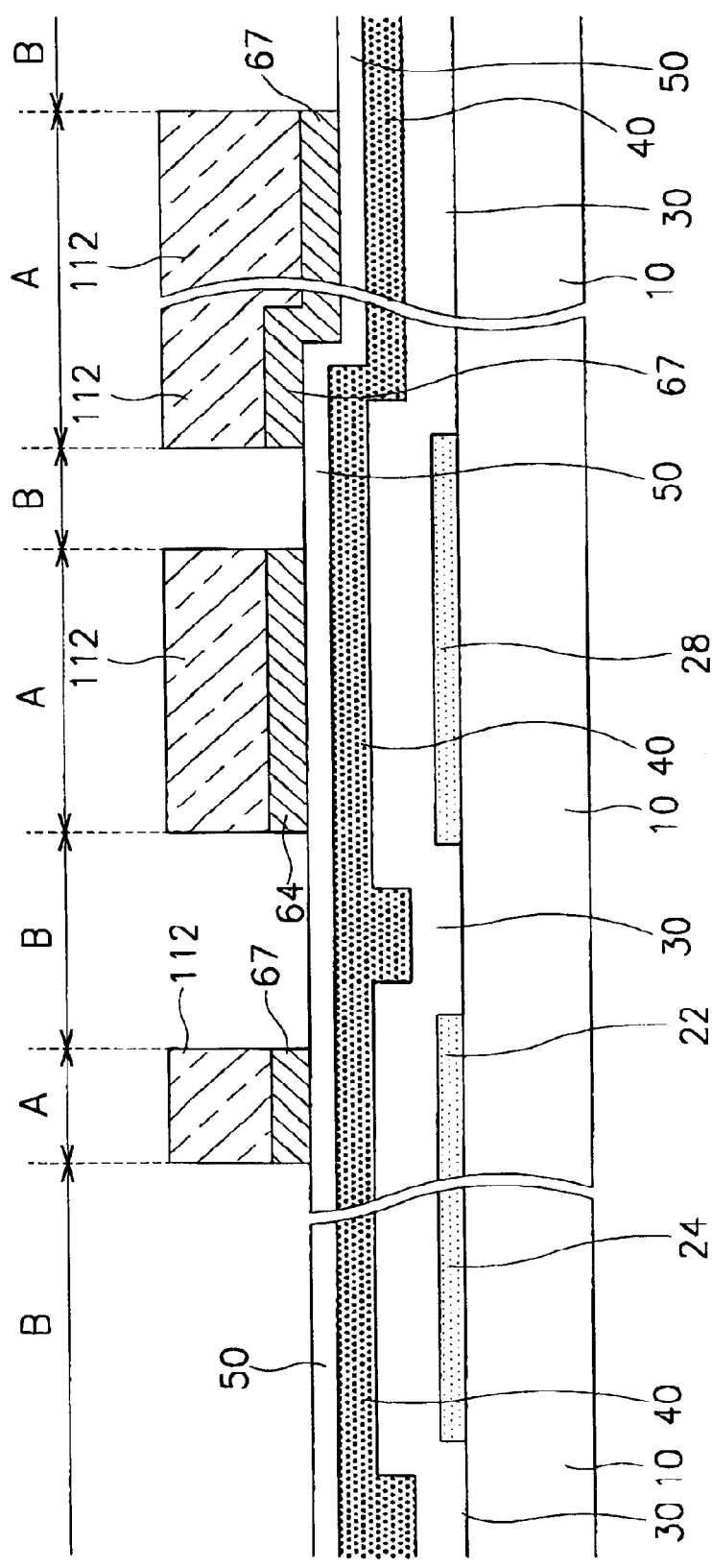
FIGS. 13A, 14A, and 15A are cross-sectional views in the next manufacturing step following that represented in FIG. 12B taken along the line XIIB-XIIB' of FIG. 12A.
Figure 13B:
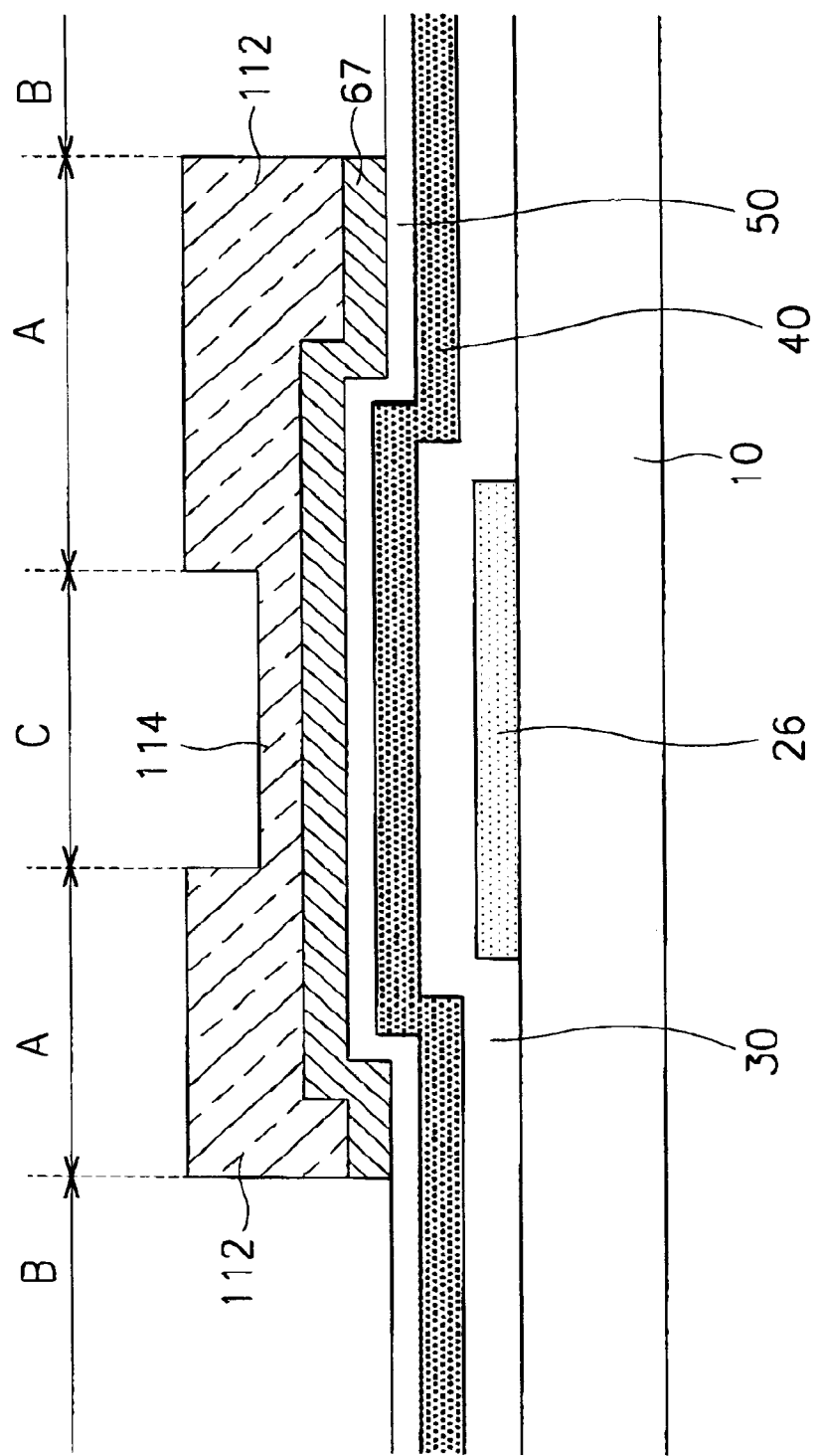
FIGS. 13B, 14B, and 15B are cross-sectional views in the next manufacturing step following that represented in FIG. 12C taken along the line XIIC-XIIC' of FIG. 12A.

As shown in FIGS. 13A and 13B, the ohmic contact layer 50 of the part B is exposed by removing the conductor layer 60 thereon. At this time, both wet and dry etch can be used, and it is preferable that the etch is performed under a condition such that the conductor layer 60 is etched but the photoresist layers 112 and 114 are not etched. However, since dry etch method is hard achieve this the photoresist patterns 112 and 114 may also be etched. In this case, the first portion 114 may be made thicker than in the wet etch so that the conductor layer 60 is not exposed.

If the conductor layer 60 is made of Mo or MoW alloy, Al or Al alloy, or Ta, both dry or wet etch methods can be used. However, if the conductor layer 60 is made of Cr, a wet etch is better because Cr is not easily removed by dry etch. CeNHO$_3$ is available as wet etchant for etching Cr conductor layer 60. Gas mixture of CF$_4$ and HCl or CF$_4$ and O$_2$ is available for dry etching Mo or MoW conductor layer 60. In this case, the etch rate of the latter system on the photoresist layer is similar to that of the conductor layer 60.

Referring to FIGS. 13A and 13B, as a result, only the portions of the conductor 67 and 64 under the photoresist layers 112 and 114 at the channel part C and the data wire part B for source/drain electrodes and a storage capacitor are left, and the remaining portion of the conductor layer 60 at part B is totally removed to expose the underlying ohmic contact layer 50. At this time, the conductor patterns 67 and 64 have the same layout as the data wire parts 62, 64, 65, 66, and 68 except that the source electrode 65 and the drain electrode 66 are connected to each other. In a dry etch, the photoresist layers 112 and 114 are also etched to a certain thickness.

Figure 14A:
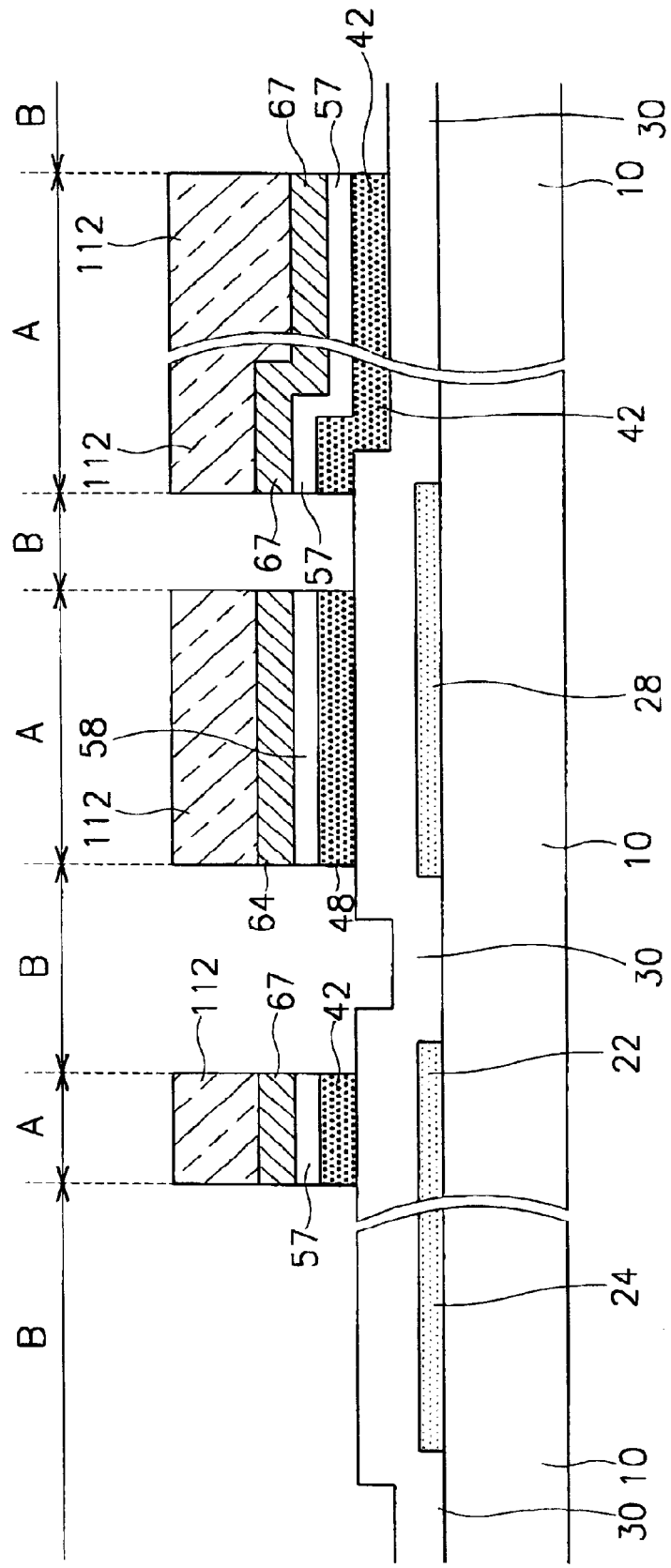
Figure 14B:
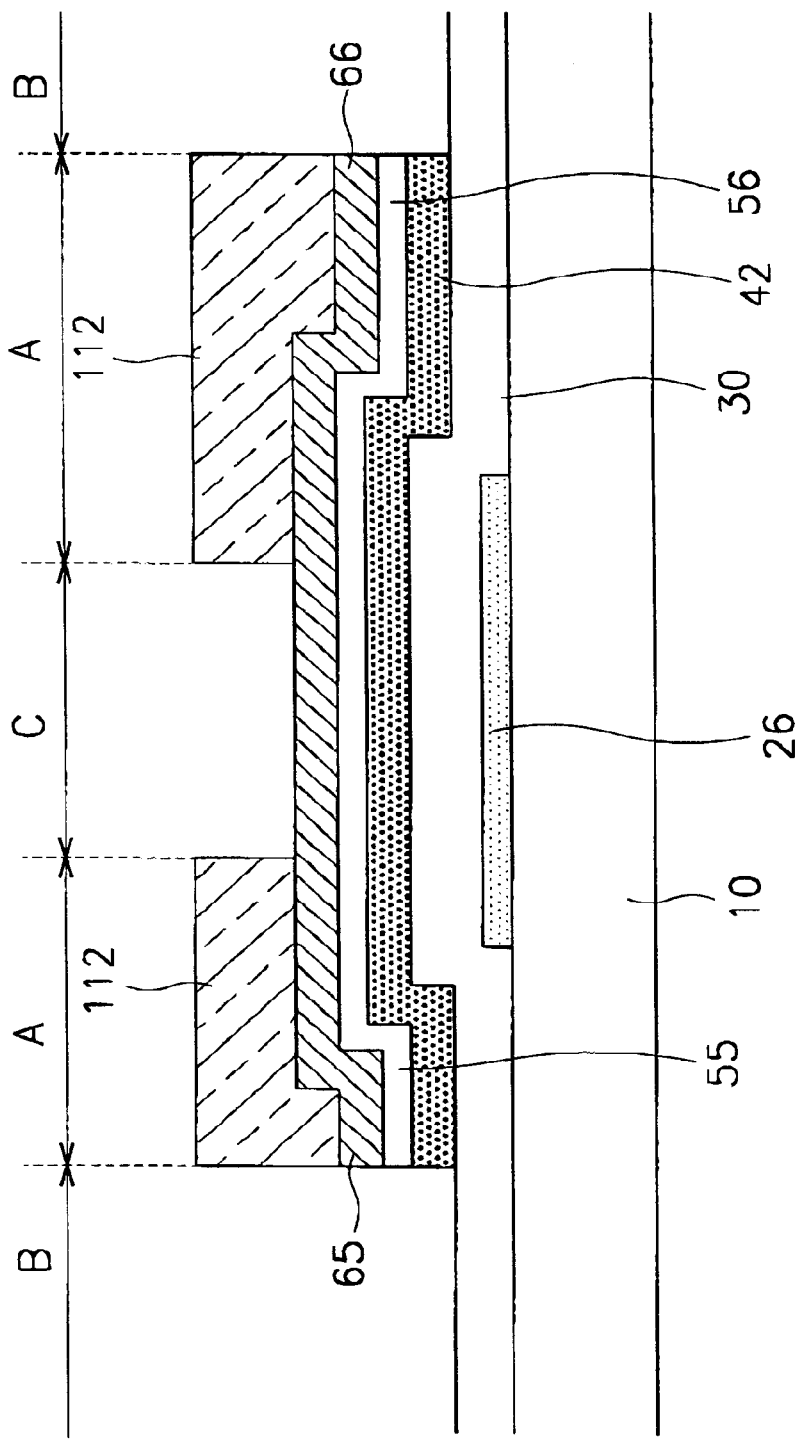

Next, the exposed portions of the ohmic conductor layer 50 at part B, and the underlying semiconductor layer 40 of FIGS. 14A and 14B are removed by dry etching along with first portion 114 of the photoresist layer. The etch condition may be such that the photoresist patterns 112 and 114, the ohmic contact layer 50 and the semiconductor layer 40 are all etched (the semiconductor layer and the ohmic contact layer have almost the same etch rate), but the gate insulating layer 30 should not be etched. It is preferable that the etch rates of the photoresist patterns 112 and 114 and the semiconductor layer 40 are almost the same. This occurs, for example, with the mixed gas systems of SF$_6$ and HCl or SF$_6$ and O$_2$. At this time, if the etch rates of the photoresist patterns 112 and 114, the semiconductor layer 40 are almost the same, the thickness of the first portion 114 is equal to or less than that of the sum of the semiconductor layer 40, and the ohmic contact layer 50. Then, as shown in FIGS. 14A and 14B, the conductor pattern 67 is exposed by removing the first portion 114 of the channel part C, and the gate insulating layer 30 are exposed by removing the ohmic contact layer 50, and the semiconductor layer 40 of the part B shown in FIG. 14B. At the same time, the thickness of the second portion 112 over the data wire part A is reduced by etching. Furthermore, the completed semiconductor patterns 42 and 48 are obtained at this step. The reference numerals 56, 57 and 58 respectively represent the ohmic contact layer pattern under the conductor patterns 67 and 64 for the source/drain the electrode and the storage capacitor.

The remaining photoresist layer on the conductor pattern 67 is then removed by ashing or plasma etching.

Figure 15A:
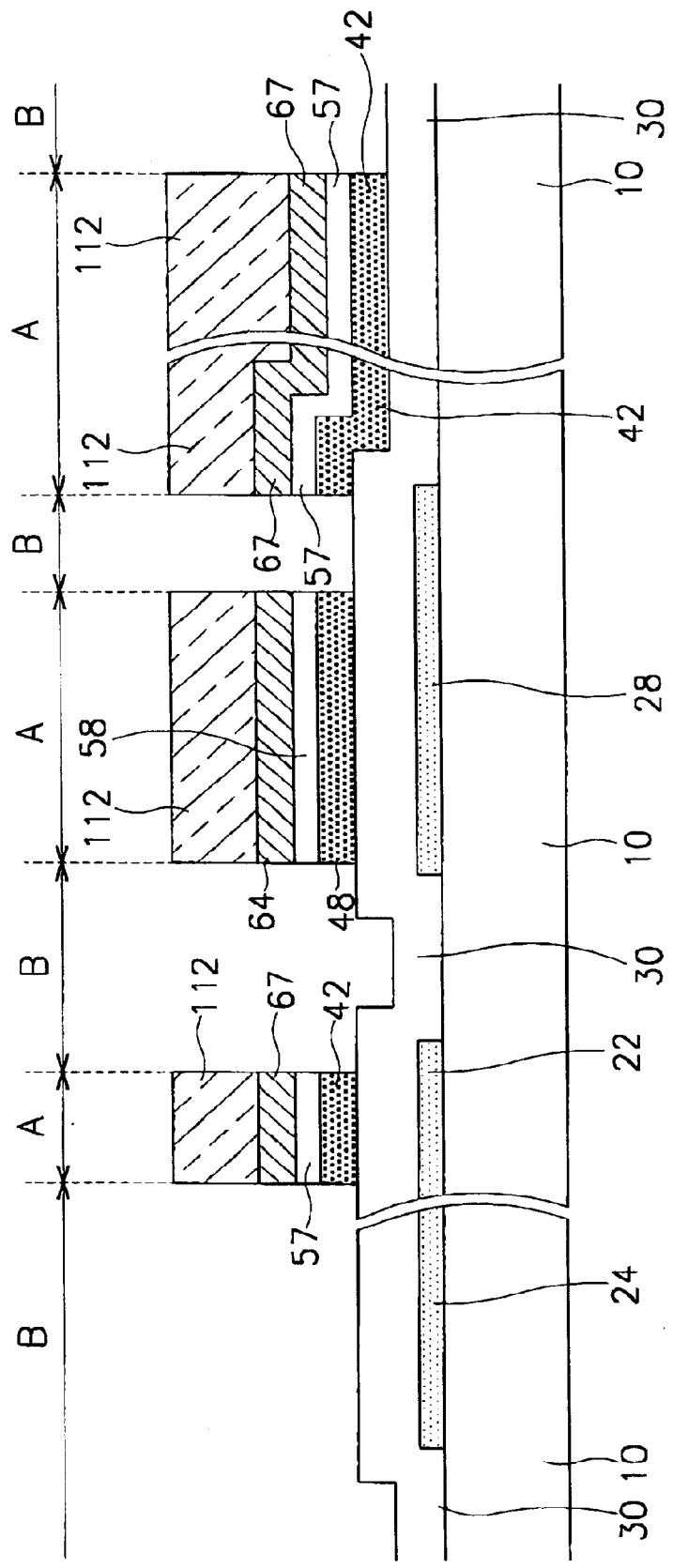
Figure 15B:
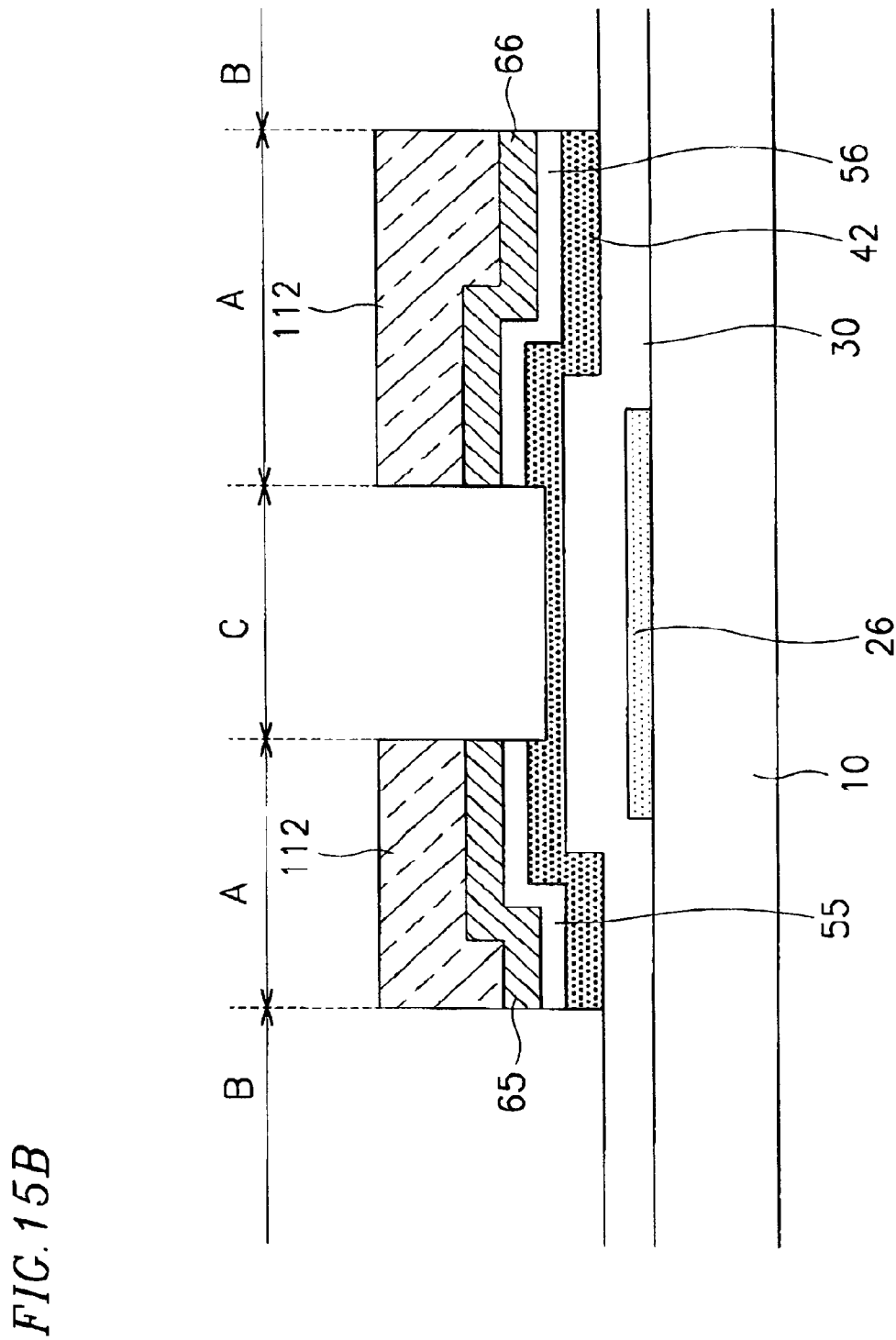

Next, as shown in 15A and 15B, the conductor pattern 67 for source/drain electrodes at the channel part C and the ohmic contact layer pattern 57 for source/drain electrodes of FIG. 14B are removed by etching. At this time, it is possible either to etch both the conductor pattern 67 and the ohmic contact layer 57 by a dry etching method, or to etch the conductor pattern 67 by a wet etching method and the ohmic contact layer 57 by a dry etching method. It is preferable in the former case that etch conditions having large etch selectivity between the conductor pattern 67 and the ohmic contact layer pattern 57 are employed. This is because if the etch selectivity is not large enough, it is hard to detect the end point of the etch and to control the thickness of the semiconductor pattern 42 around the channel part C. This can be achieved by using a mixed gas system of SF$_6$ and O$_2$, for example. In the latter case of doing the wet etch and the dry etch sequentially, the lateral sides of the conductor pattern 67 subjected to wet etch are also etched although those of the ohmic contact layer pattern 57, which is dry etched, are hardly etched at all. Thereby, the profile of these two patterns 67 and 57 makes a step like form. The mixed gas systems of CF$_4$ and O$_2$, or CF$_4$ and HCl are examples of an etch gas system for etching the ohmic contact layer pattern 57 and the semiconductor pattern 42. The semiconductor pattern 42 may also be formed to have a uniform thickness by etching with the mixed gas system of CF$_4$ and O$_2$. At this time, as shown in FIG. 15B, the thickness of the semiconductor pattern 42 may be reduced and the second portion 112 of the photoresist pattern is also etched to a certain thickness. The etch conditions may also be set not to etch the gate insulating layer 30, and it is preferable to make the photoresist pattern thick enough not to expose the data wire parts 62, 64, 65, 66, and 68.

As a result, the source electrode 65 and the drain electrode 66 are divided, and the completed data wire parts 62, 64, 65, 66, and 68 and the completed contact layer pattern 55, 56, and 58 thereunder are obtained.

Next, the remaining second portion 112 of the photoresist layer on the data wire (Region A of FIG. 12C) is removed. However, the second portion 112 may be removed after the step removing the conductor pattern 67 for source/drain electrodes on the channel part C of FIG. 14B and before the step of removing the ohmic contact layer pattern 57 under the conductor pattern 67.

To summarize, this process can be done by using both wet etching and dry etching in sequence, or by using only dry etching.

In the former case, the conductor layer of the part B is first removed by wet etching, and then the ohmic contact layer and the underlying semiconductor layer are removed by dry etching. At this time, the photoresist layer of the part C is consumed to a certain thickness, and the part C may have or may not have any residual photoresist left, which substantially depends on the initial thickness of the photoresist layer of the part C. When the part C has residual photoresist left, this residual photoresist is removed by ashing. Finally, the conductor layer of the part C is wet etched to separate the source and the drain electrodes, and the ohmic contact layer of the part C is removed by using dry etching.

In the latter case, the conductor layer, the ohmic contact layer, and the semiconductor layer of the part B are removed by dry etching. As in the former case, the part C may have or may not have residual photoresist left, and residual photoresist is removed by ashing when part C does have any residual photoresist. Finally, the conductor layer of the part C is dry etched to separate the source and the drain electrodes, and the ohmic contact layer of the part C is removed by dry etching.

Also, if the data wire is etched, the semiconductor pattern, the contact layer pattern, and the data wire may be completed with the same step at one time. That is to say, it is desirable that the photoresist pattern 114 and the underlying contact layer 50 of part C are dry etched, and the portion of the photoresist pattern 112 of part A is dry etched when dry etching the conductor layer, the ohmic contact layer, and the semiconductor layer of part B.

Since the latter process uses only one type of etching method, it is simpler, although it is harder to achieve proper etching conditions. On the other hand, the former process has the advantage of easily achieving proper etching condition, although it is more complicated.

Figure 16A:
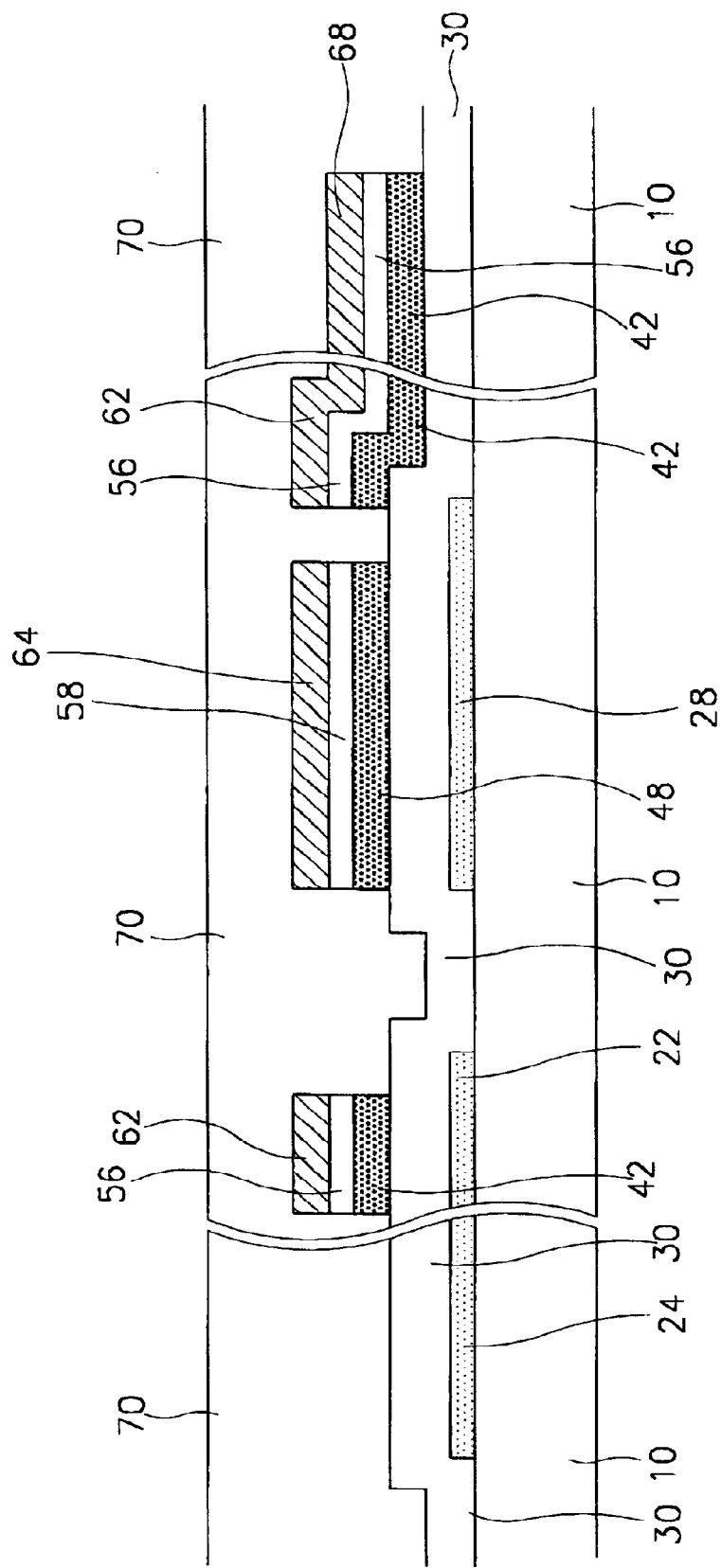
FIGS. 16A and 16B are layout views of thin film transistor array panel in the next manufacturing step following that represented in FIGS. 15A and 15B.
Figure 16B:
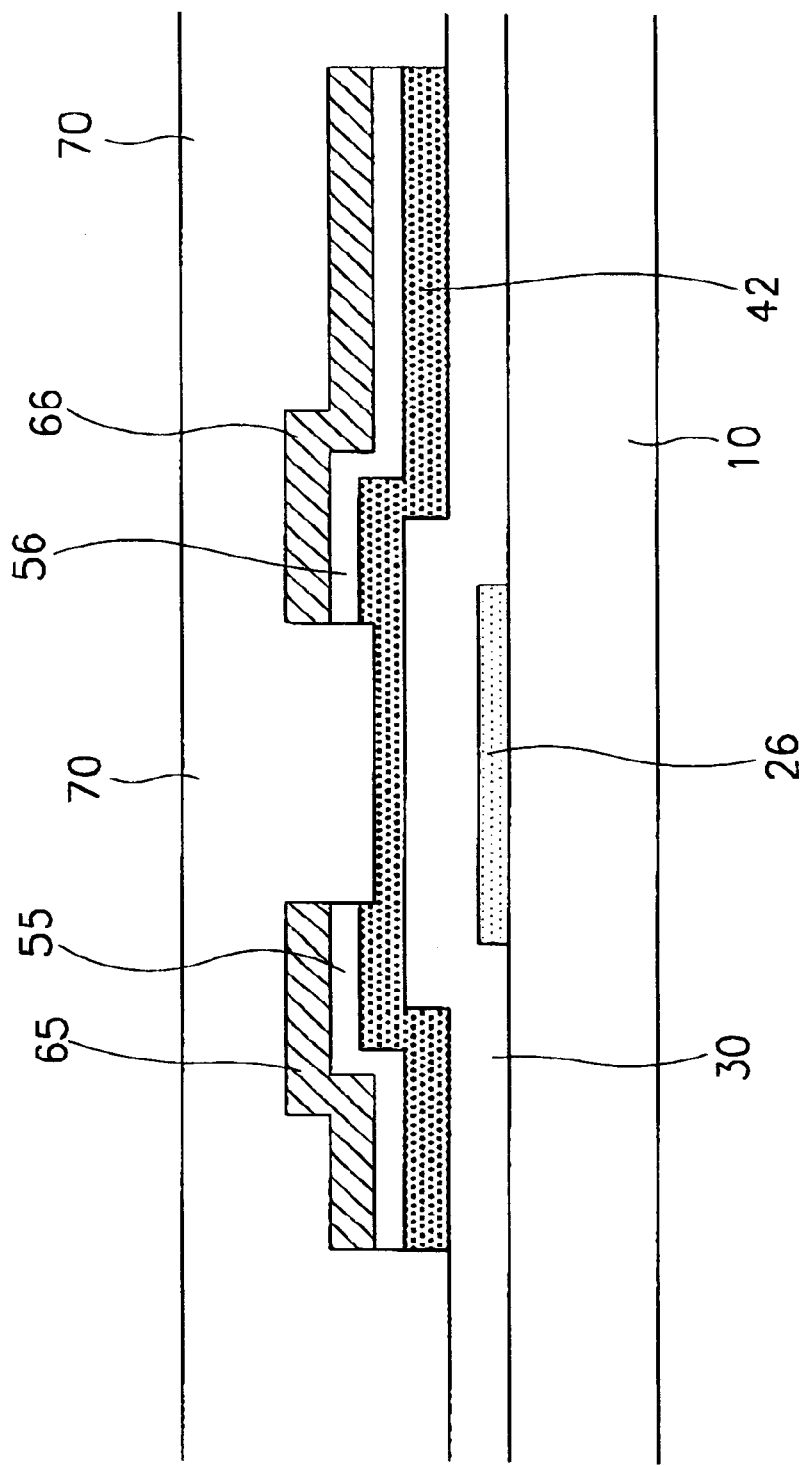

After forming data wire parts 62, 64, 65, 66, and 68 by the above steps, a passivation layer 70 is formed by such methods as chemical vapor deposition (CVD), as shown in FIGS. 16A and 16B. At this time, it is also preferable that the passivation layer 70 made of inorganic material such as silicon-nitride is deposited to a thickness of about 2,000 Å at a temperature of about 280° C. When depositing the passivation layer 70, all or part of aluminum oxide ($AlO_x$) layer having a high resistivity, which is formed on the gate wire 22, 24 and 26 during manufacturing process, may be removed. Of course, the same effect may be obtained, when forming the data wire 62, 64, 65, 66 and 68 including a metal of aluminum-based material.

Figure 17A:
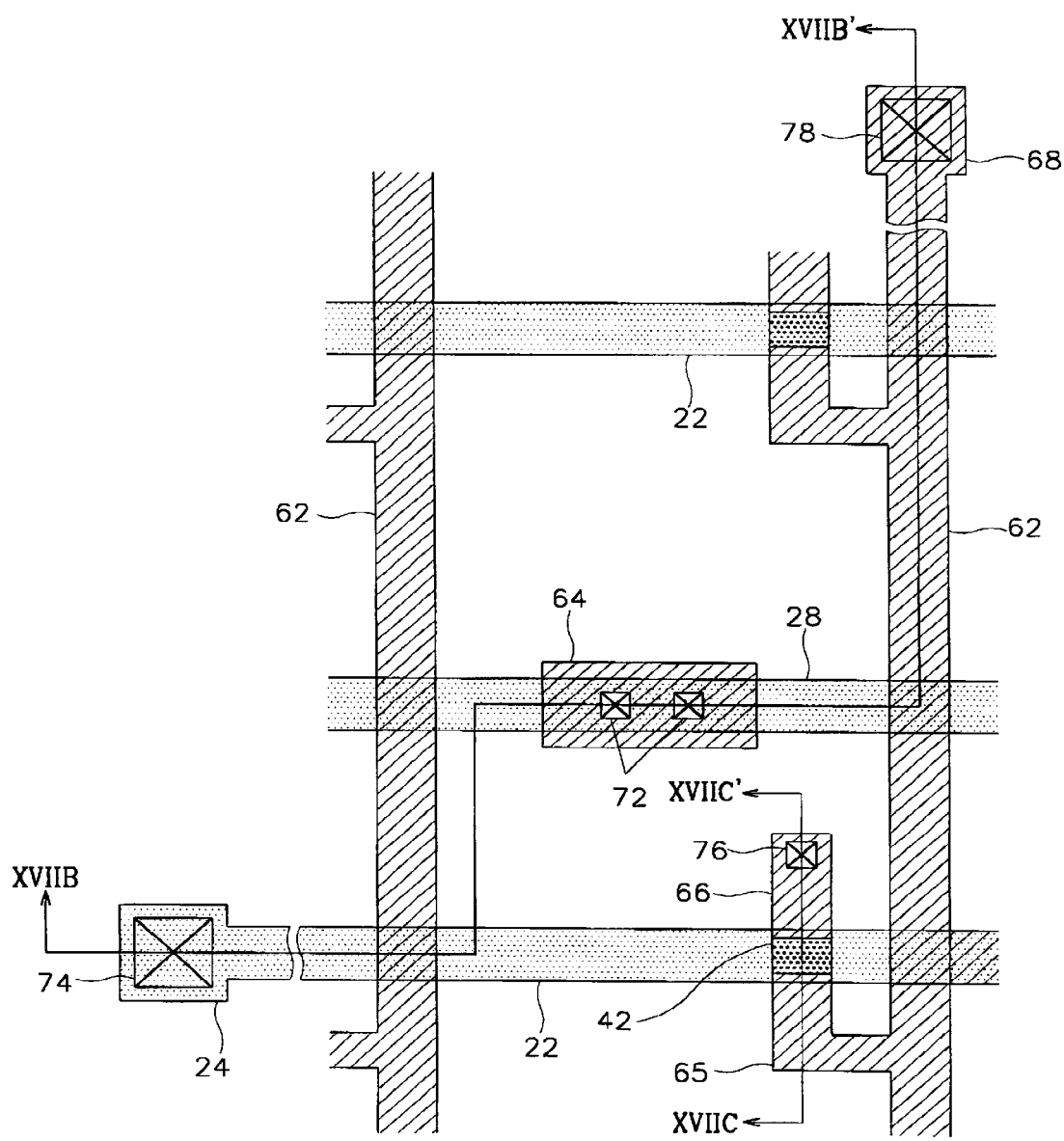
FIG. 17A is a layout view of thin film transistor array panel in the next manufacturing step following that represented in FIGS. 16A and 16B.
Figure 17B:
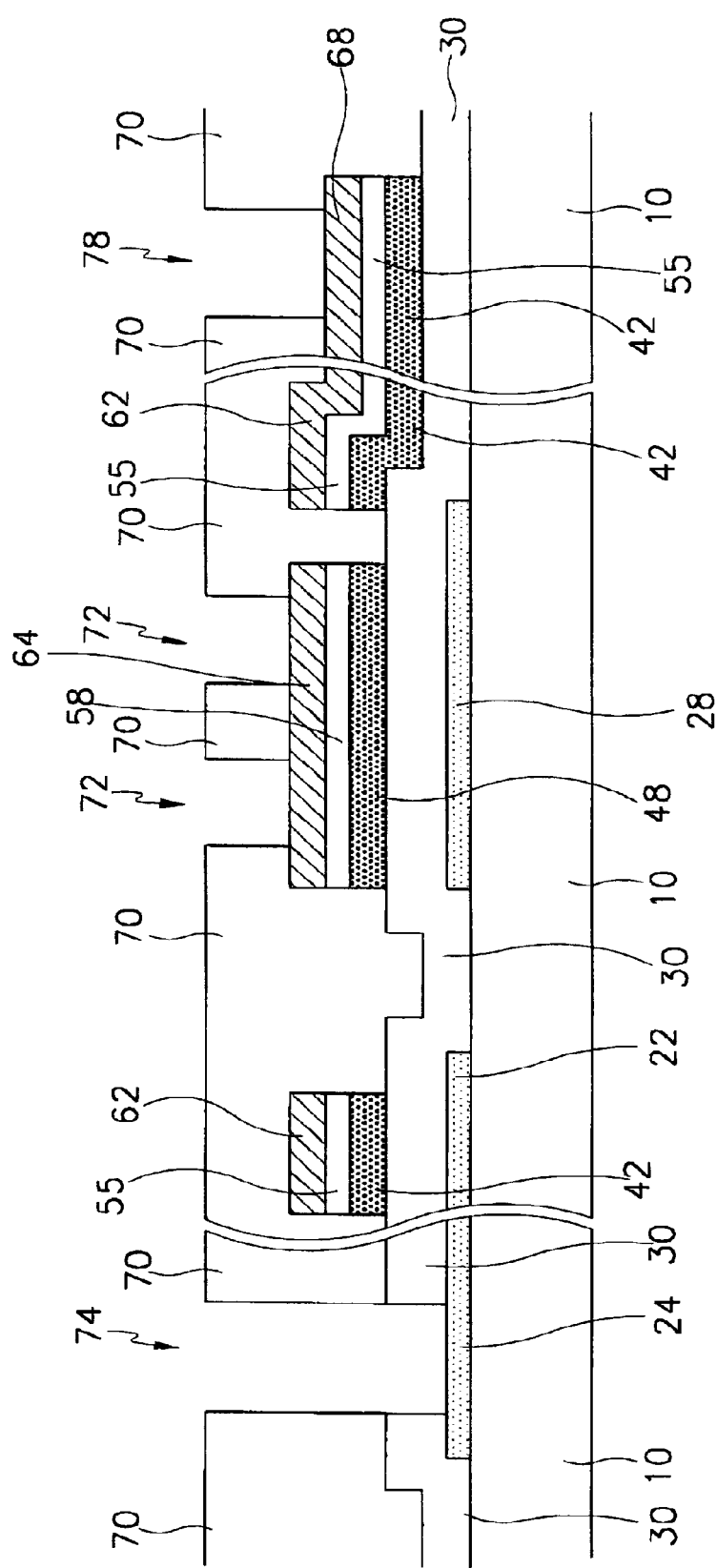
FIGS. 17B and 17C are the cross-sectional views taken along the lines XVIIB-XVIIB' and XVIIC-XVIIC' of FIG. 17A, respectively.
Figure 17C:
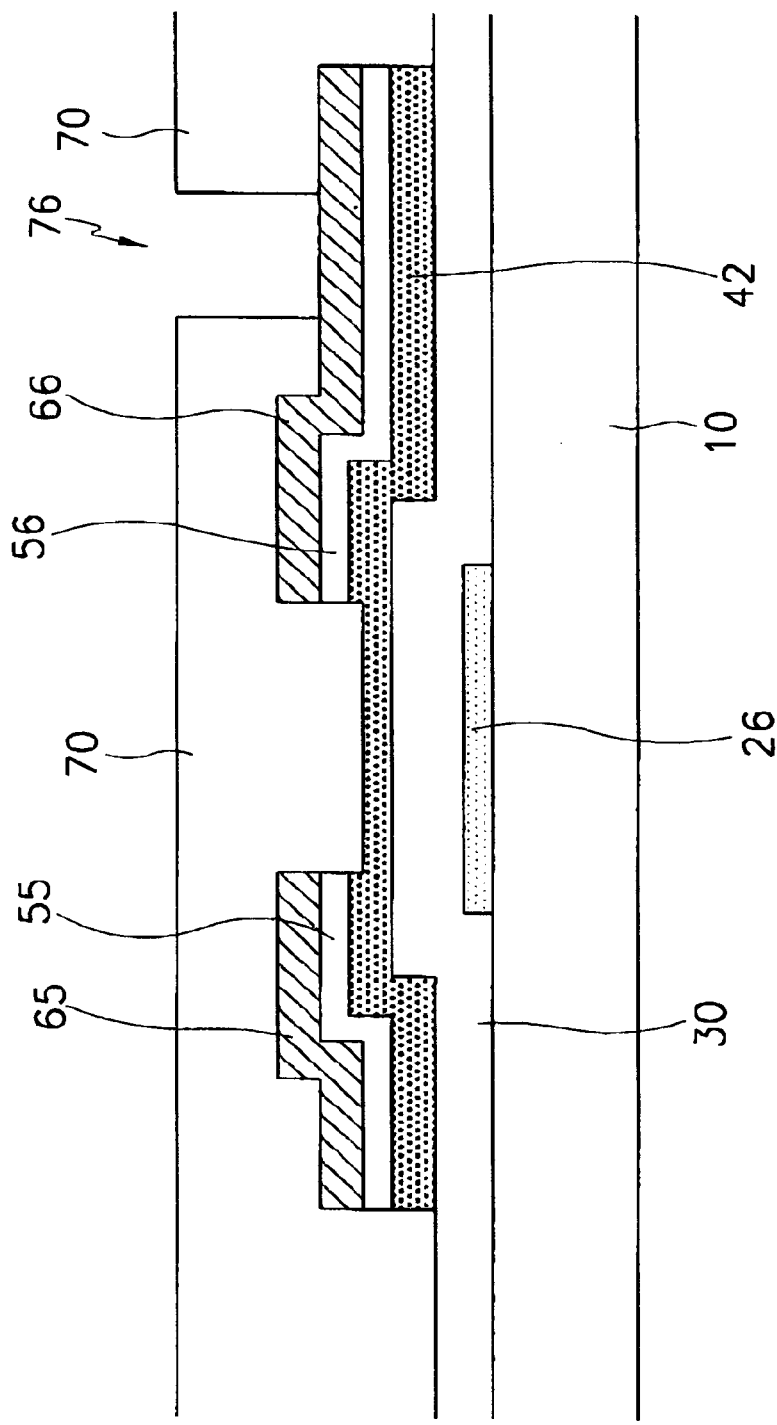

Next, the passivation layer 70 is patterned along the gate insulating layer 30 through photolithography processes using a mask to form contact holes 76, 74, 78 and 72 exposing respectively the drain electrode 66, the gate pad 24, the data pad 64, and the conductor pattern 68 for the storage capacitor, as shown in FIGS. 17A to 17C. Here, it is preferable that the squares of the contact holes 74 and 78, respectively the pads 24 and 68 are less than 2 mm×60 μm and more than 0.5 mm×15 μm.

Next, as shown in FIGS. 7 to 9, a IZO layer is deposited having a thickness of 400 Å to 500 Å at a temperature of about 150° C., and etched by using a mask to form a pixel electrode 82 connected to the drain electrode 66 and the conductor pattern 64, a redundant gate pad 86 connected to the gate pad 24, and a redundant data pad 88 connected to the data pad 68. At this time, the etchant to etch the IZO of the pixel electrode 82, the redundant gate pad 86, and the redundant data pad 88 are Cr etchant for chromium metal. Since the Cr etchant does not corrode the metal of aluminum-based material, it is possible to prevent the corrosion of the aluminum-based material in the portion of the contact structure. $HNO_3/(NH_4)_2Ce(NO_3)_6/H_2O$ is an example of the etchant. Before depositing the IZO layer, pre-heating process may be executed using inert gas of nitrogen to prevent metal oxide layer from forming on the metal layer 24, 64, 66 and 68 exposed through the contact holes 74, 72, 76 and 78. In this embodiment according the present invention, to minimize contact resistance of contact portion, it is preferable that the IZO layer is deposited in the range of less than 200° C., and the IZO thin film is formed through sputtering process by using the target including $In_2O_3$ and ZnO that comprises 15–20 at % (atomic percentage) of Zn. Also, in-situ plasma using argon, helium or hydrogen may be executed as a cleaning process before forming the IZO layer, to prevent $AlO_x$ from forming on the metal layer 24 of aluminum-based material.

In the second embodiment having the same effects as that of the first embodiment, by forming the data wire parts 62, 64, 65, 66, and 68, the ohmic contact layer pattern 55, 56, and 58, and the semiconductor patterns 42 and 48 through one photolithography process, the manufacturing method of the thin film transistor array panel may be also simplified.

In the embodiments according the present invention, the contact resistance of the contact portions may be minimized and a reliable contact portion including the pad portions may be obtained. Furthermore, by forming the wire of aluminum and aluminum alloy, the characteristics of display device may be improved in large scale LCDs, and by simplifying the manufacturing process, manufacturing costs may also be minimized.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A contact structure of a wire, comprising:
    a wire made of an aluminum-based material;
    an insulating layer covering said wire and having a contact hole exposing a portion of the wire; and
    a conductive layer made of indium zinc oxide on said insulating layer and connected directly to said wire through the contact hole.

2. The contact structure of claim 1, wherein the contact hole is more than 0.5 mm×15 μm and less than 2 mm×60 μm.

3. The contact structure of claim 1, wherein said insulating layer is made of nitride silicon.

4. The contact structure of claim 1, wherein the contact resistance of the aluminum-based material and the indium zinc oxide is less than 10% of wire resistance of the wire.

5. The contact structure of claim 4, wherein the contact resistance is less than 0.15 $\mu\Omega cm^2$.

6. A thin film transistor array panel, comprising:
    a gate wire including a gate pad, and made of an aluminum-based material on an insulating substrate;
    a gate insulating layer covering said gate wire;
    a semiconductor layer formed on said gate insulating layer;
    a data wire including a data line, a source electrode connected to the data line and adjacent to the gate electrode and a drain electrode opposite to the source electrode with respect to the gate electrode, and made of a conductive material on said gate insulating layer;
    a passivation layer covering said data wire; and
    a redundant gate pad connected directly to the gate pad through a contact hole of the gate insulating layer and the passivation layer, and made of indium zinc oxide.

7. The thin film transistor array panel of claim 6, further comprising a pixel electrode connected to the drain electrode, and made of the same indium zinc oxide as said redundant gate pad.

8. The thin film transistor array panel of claim 6, wherein said data wire further comprises a data pad connected to the data line, and
    further comprising a redundant data pad connected to the data pad, and made of indium zinc oxide with the same layer as the redundant gate pad.

9. The thin film transistor array panel of claim 6, wherein said gate insulating layer and said passivation layer are nitride silicon.

10. The thin film transistor array panel of claim 6, wherein said redundant gate pad is formed on said passivation layer.

11. The thin film transistor array panel of claim 6, wherein the contact resistance of the aluminum-based material and the indium tin oxide is less than 10% of wire resistance of the gate wire.

12. The thin film transistor array panel of claim 11, wherein the contact resistance is less than 0.15 $\mu\Omega cm^2$.

13. The contact structure of claim 6, wherein the contact hole is more than 0.5 mm×15 μm and less than 2 mm×60 μm.

* * * * *